(12) United States Patent
Long et al.

(10) Patent No.: US 12,010,885 B2
(45) Date of Patent: Jun. 11, 2024

(54) DISPLAY SUBSTRATE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yue Long, Beijing (CN); Weiyun Huang, Beijing (CN); Chao Zeng, Bejing (CN); Yao Huang, Beijing (CN); Meng Li, Bejing (CN)

(73) Assignees: CHENGDU BOE OPTOELECTRONICS TECHNOLOGY CO., LTD, Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 793 days.

(21) Appl. No.: 17/256,106

(22) PCT Filed: Aug. 1, 2019

(86) PCT No.: PCT/CN2019/098939
§ 371 (c)(1),
(2) Date: Dec. 24, 2020

(87) PCT Pub. No.: WO2021/017012
PCT Pub. Date: Apr. 2, 2021

(65) Prior Publication Data
US 2021/0225994 A1    Jul. 22, 2021

(51) Int. Cl.
*H10K 59/131*  (2023.01)
*H10K 50/844*  (2023.01)
*H10K 59/121*  (2023.01)

(52) U.S. Cl.
CPC ......... *H10K 59/131* (2023.02); *H10K 50/844* (2023.02); *H10K 59/121* (2023.02)

(58) Field of Classification Search
None
See application file for complete search history.

(56) References Cited

U.S. PATENT DOCUMENTS

| 2017/0033312 A1 | 2/2017 | Kim et al. |
| 2017/0237038 A1 | 8/2017 | Kim et al. |

(Continued)

FOREIGN PATENT DOCUMENTS

| CN | 107507850 A | 12/2017 |
| CN | 107886902 A | 4/2018 |

(Continued)

OTHER PUBLICATIONS

Extended European search report of counterpart European application No. 19933243.8 dated Jul. 14, 2022.

*Primary Examiner* — Nishath Yasmeen
(74) *Attorney, Agent, or Firm* — Lippes Mathias LLP

(57) ABSTRACT

Provided is a display substrate including a base substrate, a plurality of pixel units, at least one first power line, a blocking structure, an auxiliary connection structure, a cathode layer and a first organic pattern. A first projection region formed from an orthographic projection of the auxiliary connection structure on the base substrate and an orthographic projection of the blocking structure on the base substrate do not overlap.

20 Claims, 16 Drawing Sheets

(56) References Cited

U.S. PATENT DOCUMENTS

| | | | |
|---|---|---|---|
| 2018/0090554 A1 | 3/2018 | Choi | |
| 2020/0006697 A1* | 1/2020 | Jung | ................ H10K 59/1213 |
| 2020/0083306 A1* | 3/2020 | Choi | ................ H10K 50/8426 |
| 2020/0243781 A1* | 7/2020 | Kim | ................ H10K 50/844 |

FOREIGN PATENT DOCUMENTS

| | | |
|---|---|---|
| EP | 3067953 A1 | 9/2016 |
| KR | 20140087499 A | 7/2014 |
| KR | 20180069981 A | 6/2018 |
| KR | 20190077870 A | 7/2019 |
| KR | 20190079998 A | 7/2019 |

* cited by examiner

DISPLAY SUBSTRATE AND DISPLAY APPARATUS

CROSS-REFERENCE TO RELATED APPLICATIONS

This application is a 371 of PCT Application No. PCT/CN2019/098939, filed on Aug. 1, 2019 and entitled "DISPLAY SUBSTRATE AND DISPLAY APPARATUS", which is incorporated herein by reference in its entirety.

TECHNICAL FIELD

The present disclosure relates to a field of display technologies, and in particular, to a display substrate and a display apparatus.

BACKGROUND

A display substrate generally includes a plurality of pixel units arranged in an array in a display region of a base substrate, a power line (generally referred to as a VDD line) for providing a positive power signal to each of the pixel units, and a power line (generally referred to as a VSS line) for providing a negative power signal to a cathode layer in the display substrate. In a case that the power line enters an encapsulation region from a side of a driver chip, for example, in a case that the power line enters a region provided on a side, close to the pixel units, of a dam structure from a bonding region, that is, at a place close to a portion (line inlet port), where the power line passes through, of the dam structure, there is a risk of introducing moisture and oxygen, and the encapsulation performance needs to be improved.

SUMMARY

The present disclosure provides a display substrate and a display apparatus. The technical solutions are as follows:

In one aspect, a display substrate is provided, which includes:
a base substrate;
a plurality of pixel units, located on the base substrate;
at least one first power line, located on the base substrate;
a blocking structure, surrounding the plurality of pixel units;
an auxiliary connection structure, including a first side surface and a second side surface opposite to the first side surface, the first side surface being closer to the plurality of pixel units than the second side surface;
a cathode layer, located on aside of the auxiliary connection structure distal from the base substrate; and
a first organic pattern, located on the side of the auxiliary connection structure distal from the base substrate,
wherein one end of the at least one first power line is located on a side of the blocking structure distal from the plurality of pixel units, and is configured for receiving a power signal; and the other end of the at least one first power line is located between the blocking structure and the plurality of pixel units, and is connected to the cathode layer through the auxiliary connection structure;
an orthographic projection of the auxiliary connection structure on the base substrate has a first projection region and a second projection region, the first projection region and an orthographic projection of the blocking structure on the base substrate do not overlap, and the second projection region and the orthographic projection of the blocking structure on the base substrate overlap at a first overlapping region; and
the first projection region is closer to the end of the at least one first power line for receiving the power signal than the second projection region.

Optionally, one end of the at least one first power line is located in a middle portion of the side of the blocking structure distal from the plurality of pixel units.

Optionally, the auxiliary connection structure is in a ring construction surrounding the plurality of pixel units.

Optionally, the first organic pattern covers at least a part of the second side surface, an orthographic projection of the first organic pattern and an orthographic projection of the at least one first power line on the base substrate have a second overlapping region, and the second overlapping region and the orthographic projection of the blocking structure on the base substrate do not overlap.

Optionally, the second side surface includes a portion covered by the first organic pattern and a portion covered by the blocking structure.

Optionally, a distance between the second overlapping region and the orthographic projection of the blocking structure on the base substrate is greater than a threshold distance.

Optionally, the threshold distance is in a range from 80 microns to 150 microns.

Optionally, the display substrate further includes: at least one second power line, wherein the at least one second power line includes a first portion and a second portion;
the first portion is located on the side of the blocking structure distal from the plurality of pixel units, and is configured for receiving the power signal;
the second portion is connected to the cathode layer through the auxiliary connection structure; and
the second portion includes a first junction and a second junction that are connected to the auxiliary connection structure, and a distance between the first junction and the blocking structure is greater than a distance between the second junction and the blocking structure.

Optionally, the display substrate has a bonding region located on the side of the blocking structure distal from the plurality of pixel units; and
the first junction is closer to the bonding region than the second junction.

Optionally, the display substrate further includes a row driving region located between the plurality of pixel units and the blocking structure; and
a distance between the row driving region and the orthographic projection of the at least one first power line on the base substrate is greater than a distance between the row driving region and an orthographic projection of the at least one second power line on the base substrate.

Optionally, the display substrate further includes:
a passivation layer covering the at least one first power line;
wherein an opening is further provided in the passivation layer, a side of the auxiliary connection structure proximal to the base substrate is connected to the at least one first power line through the opening, and a side of the auxiliary connection structure distal from the base substrate is connected to the cathode layer.

Optionally, the blocking structure includes: a first blocking dam and a second blocking dam;
the first blocking dam is farther away from the plurality of pixel units than the second blocking dam, and a thickness of the first blocking dam is greater than a thickness of the second blocking dam;

the first blocking dam includes: a first planarization layer pattern, a second planarization layer pattern and a second organic pattern which are arranged along a direction away from the base substrate;

the second blocking dam includes: a third planarization layer pattern and a third organic pattern which are arranged along the direction away from the base substrate; and wherein the second planarization layer pattern and the third planarization layer pattern include a same material, and the first organic pattern, the second organic pattern and the third organic pattern include a same material.

Optionally, the blocking structure includes: a first blocking dam and a second blocking dam;

the first blocking dam is farther away from the plurality of pixel units than the second blocking dam, and a thickness of the first blocking dam is greater than a thickness of the second blocking dam;

the first blocking dam includes: a planarization layer pattern and a second organic pattern which are sequentially arranged in layers along a direction away from the base substrate;

the second blocking dam includes: a third organic pattern arranged on the base substrate; and the first organic pattern, the second organic pattern and the third organic pattern include a same material.

Optionally, the first blocking dam further includes: a fourth organic pattern arranged on a side of the second organic pattern distal from the base substrate;

the second blocking dam further includes: a fifth organic pattern arranged on a side of the third organic pattern distal from the base substrate; and the fourth organic pattern and the fifth organic pattern include a same material.

Optionally, the blocking structure includes: a first blocking dam and a second blocking dam;

the first blocking dam is farther away from the plurality of pixel units than the second blocking dam, and a thickness of the first blocking dam is greater than a thickness of the second blocking dam; and the first organic pattern has a portion which is in direct contact with the second blocking dam.

Optionally, the second power line in the display substrate includes: a straight portion and an arc-shaped portion which surround a region where the plurality of pixel units are located; and an orthographic projection of the portion of the first organic pattern which is in direct contact with the second blocking dam on the base substrate is located within an orthographic projection of the arc-shaped portion on the base substrate.

Optionally, the straight portion and the arc-shaped portion which surround the region where the plurality of pixel units are located are included in the second portion of the second power line.

Optionally, the first blocking dam is a first ring, and the second blocking dam is a second ring;

the first organic pattern and a part of the third organic pattern define a third ring, an orthographic projection of the third ring on the base substrate is located within an orthographic projection of the second ring on the base substrate, and the orthographic projection of the second ring on the base substrate is located within an orthographic projection of the first ring on the base substrate; and the third ring surrounds the plurality of pixel units.

Optionally, the at least one first power line includes: a first metal layer; the display substrate further includes: an auxiliary metal layer located on a side of the first metal layer distal from the base substrate; and a side of the auxiliary metal layer distal from the first metal layer is in contact with the auxiliary connection structure, and an orthographic projection of the auxiliary metal layer on the base substrate and the orthographic projection of the blocking structure on the base substrate do not overlap.

Optionally, the first metal layer, the passivation layer, the first planarization layer pattern, the auxiliary metal layer, the second planarization layer pattern and the first organic pattern of the display substrate are arranged in layers along a direction away from the base substrate.

Optionally, the at least one first power line includes: a first metal layer and a second metal layer which are arranged along a direction away from the base substrate; and a side of the second metal layer distal from the first metal layer is in contact with the auxiliary connection structure.

Optionally, the first metal layer, the first planarization layer pattern, the second metal layer, the passivation layer, the second planarization layer pattern and the first organic pattern of the display substrate are arranged in layers along a direction away from the base substrate.

Optionally, a plurality of tooth-shaped protruding structures are provided on a side surface of the at least one first power line located on the side of the blocking structure distal from the plurality of pixel units.

Optionally, orthographic projections of the protruding structures on the base substrate and the orthographic projection of the blocking structure on the base substrate do not overlap.

Optionally, the display substrate further includes: an encapsulation film layer, wherein the encapsulation film layer is located on a side of the first power line distal from the base substrate, and the encapsulation film layer covers a region surrounded by the blocking structure.

Optionally, the display substrate further includes: a plurality of third power lines located on the base substrate, wherein the plurality of third power lines are electrically connected to transistors in pixels of the display substrate.

Optionally, an orthographic projection of at least one of the plurality of third power lines on the base substrate is adjacent to the orthographic projection of the first power line on the base substrate; and orthographic projections of the plurality of third power lines on the base substrate and the orthographic projection of the auxiliary connection structure on the base substrate have an overlapping region, and in the overlapping region, a passivation layer is disposed between the plurality of third power lines and the auxiliary connection structure.

In another aspect, a display apparatus is provided, which includes the display substrate in the above aspect.

The technical solutions provided by the present disclosure at least include the following beneficial effects:

The present disclosure provides a display substrate and a display apparatus. The display substrate includes a base substrate, a plurality of pixel units, at least one first power line, a blocking structure, an auxiliary connection structure, a cathode layer and a first organic pattern. A first projection region of an orthographic projection of the auxiliary connection structure on the base substrate and an orthographic projection of the blocking structure on the base substrate do not overlap, such that the first organic pattern is spaced apart from the blocking structure; and therefore, the moisture brought in by one end of the first power line for receiving a power signal can be prevented from being introduced into the pixel units through the blocking structure and the first organic pattern, guaranteeing the yield of the display substrate, as well as the display effect of the display substrate.

BRIEF DESCRIPTION OF THE DRAWINGS

In order to clearly illustrate the technical solutions of the embodiments of the present disclosure, the drawings of the embodiments will be briefly described. Apparently, the accompanying drawings in the following description show merely some embodiments of the present disclosure, and a person of ordinary skill in the art can derive other drawings from these accompanying drawings without any creative effort.

DETAILED DESCRIPTION

In order to make objects, technical solutions and advantages of the present disclosure more clear, embodiments of the present disclosure will be described in a clearly and fully understandable way in connection with the related drawings.

In related technologies, in order to reduce the risk of moisture and oxygen erosion brought by power lines entering an encapsulation region from an outside of the encapsulation region, the total number of the power lines entering the encapsulation region is usually reduced; in this way, in order to further ensure the electrical signal transmission of the power lines, for example, to ensure the electrical connection between a cathode VSS line and a cathode, one end of the VSS line needs to be connected with the cathode layer by an auxiliary connection structure located in the encapsulation region of the base substrate after the one end of the VSS line enters the encapsulation region, for example, enters a dam structure (a blocking structure). However, the inventors found that if the auxiliary connection structure such as a conductive metal structure is directly added, although a connection effect between the cathode and the cathode power line is improved, a side surface of the auxiliary connection structure is easy to have etching defects, which also increases the risk of moisture and oxygen erosion near the line inlet port.

Figure 1:
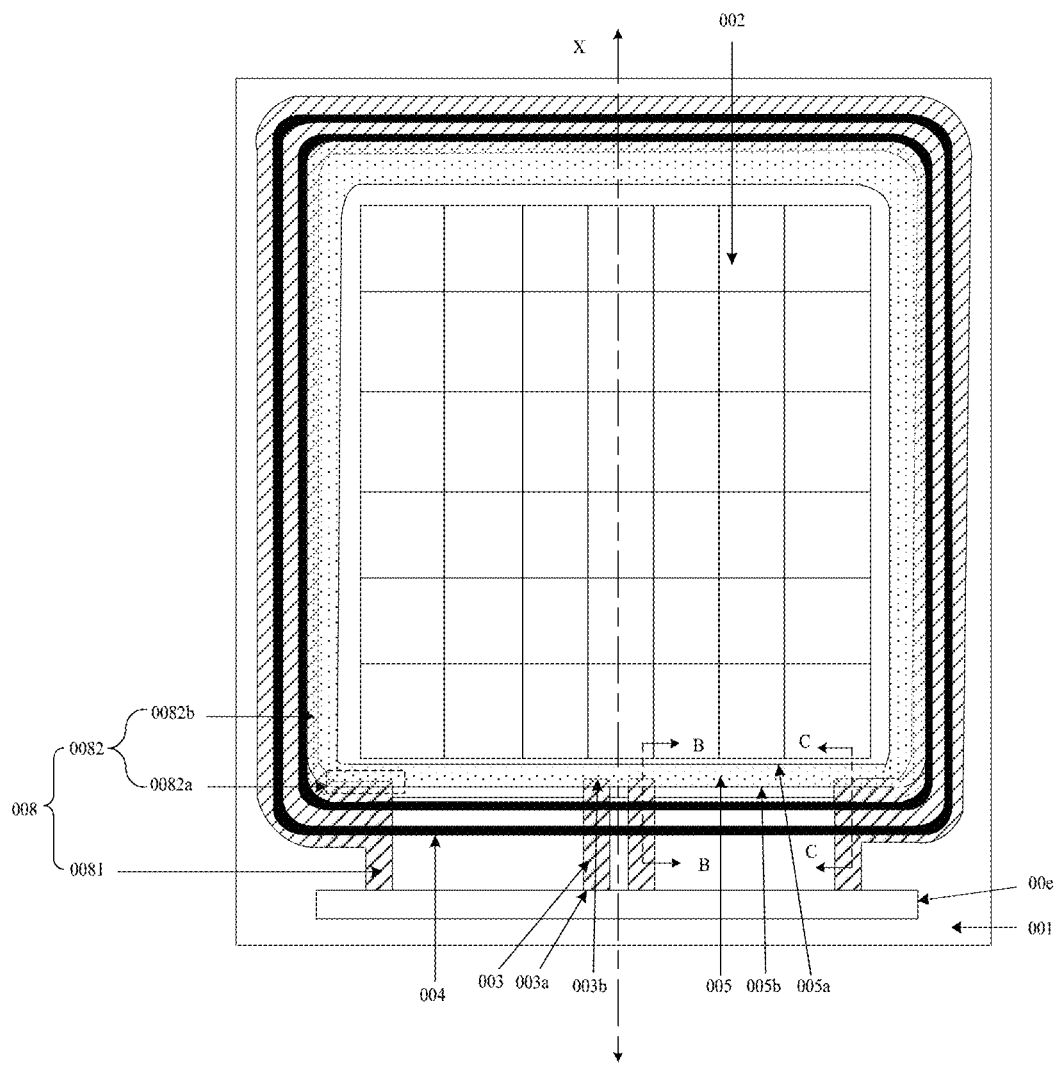
FIG. 1 is a schematic structural diagram of a display substrate according to an embodiment of the present disclosure.
Figure 2:
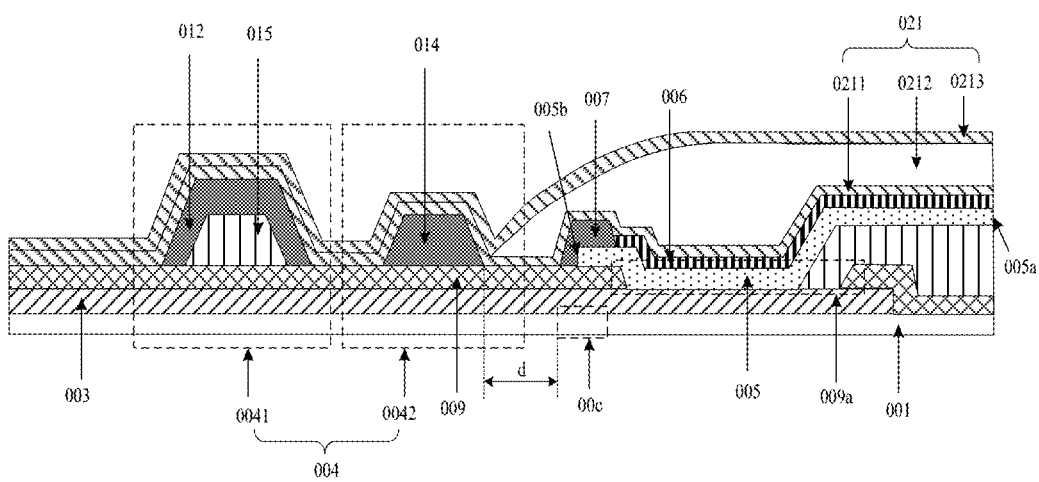
FIG. 2 is a sectional view of the display substrate shown in FIG. 1 taken along a direction of BB.

FIG. 1 is a schematic structural diagram of a display substrate according to an embodiment of the present disclosure. FIG. 2 is a sectional view of the display substrate shown in FIG. 1 taken along a direction of BB. The display substrate may be a flexible panel, and may be, for example, a foldable panel. As can be seen with reference to FIGS. 1 and 2, the display substrate may include: a base substrate 001, a plurality of pixel units 002, at least one first power line 003, a blocking structure 004, an auxiliary connection structure 005, a cathode layer 006 and a first organic pattern 007. The plurality of pixel units 002 may be located on the base substrate 001. For clearly showing the auxiliary connection structure 005, the cathode layer 006 is not shown in FIG. 1.

The at least one first power line 003 is located on the base substrate 001. The blocking structure 004 may surround the plurality of pixel units 002. The auxiliary connection structure 005 may include a first side surface 005a and a second side surface 005b which are opposite to each other, and the first side surface 005*a* is closer to the plurality of pixel units 002 than the second side surface 005*b* is. The cathode layer 006 may be located on a side of the auxiliary connection structure 005 distal from the base substrate 001. The first organic pattern 007 may be located on the side of the auxiliary connection structure 005 distal from the base substrate 001.

One end 003*a* of the at least one first power line 003 is located on a side of the blocking structure (the dam structure) 004 distal from the plurality of pixel units 002 and is configured for receiving a power signal. The other end 003*b* of the at least one first power line 003 is located between the blocking structure 004 and the plurality of pixel units 002 and is connected with the cathode layer 006 through the auxiliary connection structure 005, thereby enabling the first power line 003 to provide the power signal to the cathode layer 006.

In at least one embodiment of the present disclosure, one end 003*a* of each first power line 003 is located outside a region surrounded by the blocking structure (the dam structure) 004, and the other end is located within the region surrounded by the blocking structure 004, i.e., each first power line 003 can pass through the blocking structure 004 to enter the region surrounded by the blocking structure 004. Here, the portion of the blocking structure 004 configured for allowing the power line to pass through can also be referred to as a line inlet port. For example, the portion allowing the first power line 003 to pass through may be referred to as a first line inlet port 00*a*.

Exemplarily, two first power lines 003 are illustrated in FIG. 1, and the end 003*a* of each first power line 003 is connected with a driving chip for receiving the power signal provided by the driving chip.

Figure 3:
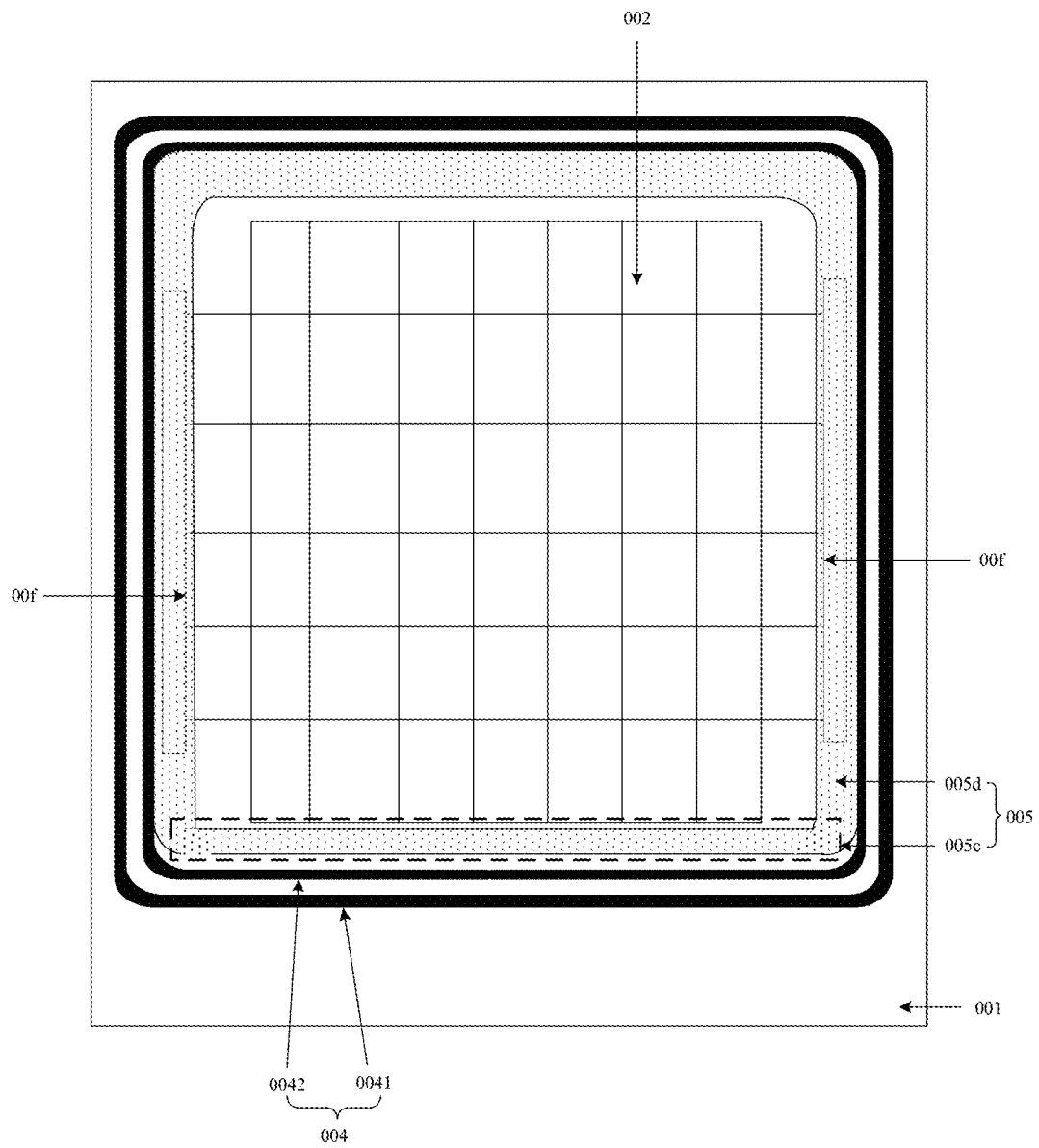
FIG. 3 is a schematic structural diagram of another display substrate according to an embodiment of the present disclosure.
Figure 4:
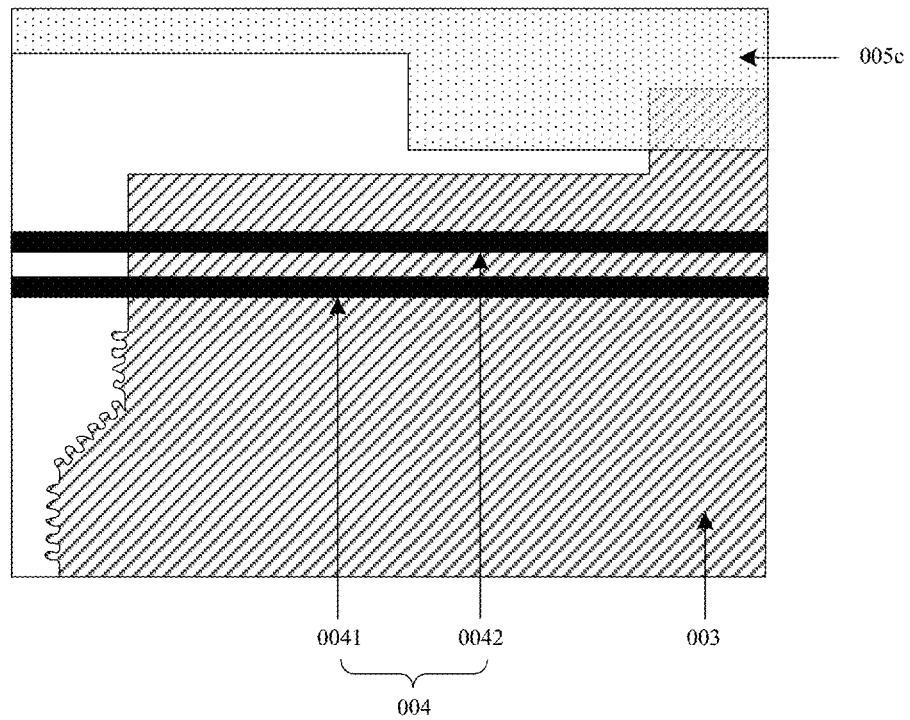
FIG. 4 is a local schematic structural diagram of a display substrate according to an embodiment of the present disclosure.

FIG. 3 is a schematic structural diagram of another display substrate according to an embodiment of the present disclosure. FIG. 4 is a local schematic structural diagram of a display substrate according to an embodiment of the present disclosure. As can be seen with reference to FIGS. 1, 3 and 4, an orthographic projection of the auxiliary connection structure 005 on the base substrate 001 may include a first projection region 005*c* and a second projection region 005*d*. As can be seen with reference to FIG. 1, the first projection region 005*c* is closer to the end 003*a* of the at least one first power line 003 for receiving the power signal than the second projection region 005*d* is. The first projection region 005*c* and an orthographic projection of the blocking structure 004 on the base substrate 001 do not overlap; and the second projection region 005*d* and the orthographic projection of the blocking structure 004 on the base substrate 001 overlap to form a region including a first overlapping region 00*b*. For clearly illustrating a positional relationship between the auxiliary connection structure 005 and the blocking structure 004, the first power line 003, a second power line 008 and the cathode layer 006 are not shown in FIG. 3.

As the second side surface 005*b* of the auxiliary connection structure 005 is easy to be corroded by moisture or oxygen, a first organic pattern 007 may be generally configured to cover at least a part of the second side surface 005*b*, thereby guaranteeing that the auxiliary connection structure 005 can effectively transmit the power signal from the first power line 003.

The organic material for manufacturing the first organic pattern 007 is a hydrophilic material, therefore, by disposing the first projection region 005*c* formed from the orthographic projection of the auxiliary connection structure 005 on the base substrate 001 as not overlapping with the orthographic projection of the blocking structure 004 on the base substrate 001, the first organic pattern 007 is configured to be not in contact with the blocking structure 004 when it covers at least a part of the second side surface 005*a* of the auxiliary connection structure 005 at the first projection region 005*c*, i.e., the first organic pattern 007 is configured to be spaced apart from the blocking structure 004; and therefore, the moisture brought in by the end 003*a* of the first power line 003 for receiving the power signal can be prevented from being further introduced into the plurality of pixel units 002 through the blocking structure 004 and the first organic pattern 007, thereby guaranteeing the yield of the display substrate.

Optionally, the width of a lap joint between the auxiliary connection structure 005 and the first power line 003 can be relatively wide, so as to guarantee that the contact resistance between the auxiliary connection structure 005 and the first power line 003 is as small as possible. Here, referring to FIG. 4, an orthographic projection of the lap joint on the base substrate is an area where the first projection region 005*c* and the orthographic projection of the first power line 003 on the base substrate 001 overlap. The width of other portions of the auxiliary connection structure 005 distal from the lap joint may be narrow, so as to reduce the capacitive coupling effect on other signal lines provided on the side of the auxiliary connection structure 005 proximal to the base substrate. For example, the capacitive coupling effect on the data lines can be reduced.

In summary, the embodiments of the present disclosure provide a display substrate, which includes a base substrate, a plurality of pixel units, at least one first power line, a blocking structure, an auxiliary connection structure, a cathode layer and a first organic pattern. A first projection region of an orthographic projection of the auxiliary connection structure on the base substrate and an orthographic projection of the blocking structure on the base substrate do not overlap, such that the first organic pattern is spaced apart from the blocking structure; and therefore, the moisture brought in by one end of the first power line for receiving a power signal can be prevented from being introduced into the pixel units through the blocking structure and the first organic pattern, thereby guaranteeing the yield of the display substrate, as well as the display effect of the display substrate.

It should be noted that in the embodiments of the present disclosure, the region where the orthographic projections of the plurality of pixel units 002 on the base substrate 001 are located may be an active area (AA) of the display substrate, also known as a display region or an AA region. Therefore, the blocking structure 004 can be disposed to surround the AA region. The cathode layer 006 may form an entire layer to cover the AA region.

Optionally, in the embodiments of the present disclosure, the orthographic projection of the cathode layer 006 on the base substrate 001 may cover the orthographic projections of the plurality of pixel units 002 on the base substrate 001; and the orthographic projection of the cathode layer 006 on the base substrate 001 may be inside the orthographic projection of the region surrounded by the blocking structure 004 on the base substrate 001.

Figure 5:
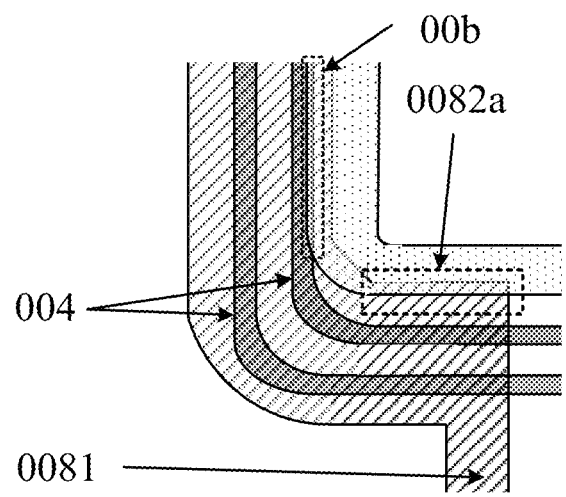
FIG. 5 is a local schematic structural diagram of the display substrate shown in FIG. 1.

It can further be seen with reference to FIGS. 1, 2 and 5 that the first organic pattern 007 may cover at least a portion of the second side surface 005*b* of the auxiliary connection structure 005; an orthographic projection of the first organic pattern 007 and the orthographic projection of the at least one first power line 003 on the base substrate 001 overlap at a second overlapping region 00*c*, and the second overlapping region 00c and the orthographic projection of the blocking structure 004 on the base substrate 001 do not overlap.

By covering at least a portion of the second side surface 005b of the auxiliary connection structure 005 with the first organic pattern 007, the risk of the second side surface of the auxiliary connection structure 005 being eroded by moisture or oxygen due to the etching defect can be reduced, thereby guaranteeing that the auxiliary connection structure 005 can effectively transmit the power signal from the first power line 003. Furthermore, as the organic material for manufacturing the first organic pattern 007 is typically a hydrophilic material, therefore, by disposing the second overlapping region 00c as not overlapping with the orthographic projection of the blocking structure 004 on the base substrate, i.e., making the first organic pattern 007 be spaced apart from the blocking structure 004, the moisture brought in by the end 003a of the first power line 003 for receiving the power signal can be prevented from being introduced into the pixel unit 002 through the blocking structure 004 and the first organic pattern 007, thereby guaranteeing the yield of the display substrate.

Optionally, in at least one embodiment of the present disclosure, a distance between the second overlapping region 00c, where the orthographic projection of the first organic pattern 007 and the orthographic projection of the at least one first power line 003 on the base substrate 001 overlap, and the orthographic projection of the blocking structure 004 on the base substrate 001, may be greater than a threshold distance. Here, the threshold distance may be in a range from 80 microns (μm) to 150 μm. For example, the threshold distance may be 90 μm, 100 μm, 110 μm, 120 μm, 130 μm, 140 μm, etc. That is, a certain distance is presented between the first organic pattern 007 and the blocking structure 004. As such, the first organic pattern 007 can be prevented from directly contacting the blocking structure 004 near the first line inlet port 00a of the first power line 003, and the moisture can be further prevented from being introduced into the pixel unit 002 through the first organic pattern 007, thereby guaranteeing the encapsulation effect. Here, the threshold distance may be a threshold that is determined in advance through experiments as being able to prevent the moisture from entering the pixel units 002. That is, when the distance between the second overlapping region 00c and the blocking structure 004 is greater than the threshold distance, it is hard for the moisture to enter the pixel units 002 in the display substrate.

Here, the threshold distance may be a threshold that is determined in advance through experiments as being able to prevent the moisture from entering the pixel units 002. That is, when the distance between the second overlapping region 00c and the blocking structure 004 is greater than the threshold distance, the moisture would not enter the pixel units 002 in the display substrate.

Referring to FIGS. 1 and 3, the second side surface 005b of the auxiliary connection structure 005 may also be covered by the blocking structure 004. That is, the second side surface 005b of the auxiliary connection structure 005 in the second projection region 005d may be covered by the blocking structure 004.

Figure 6:
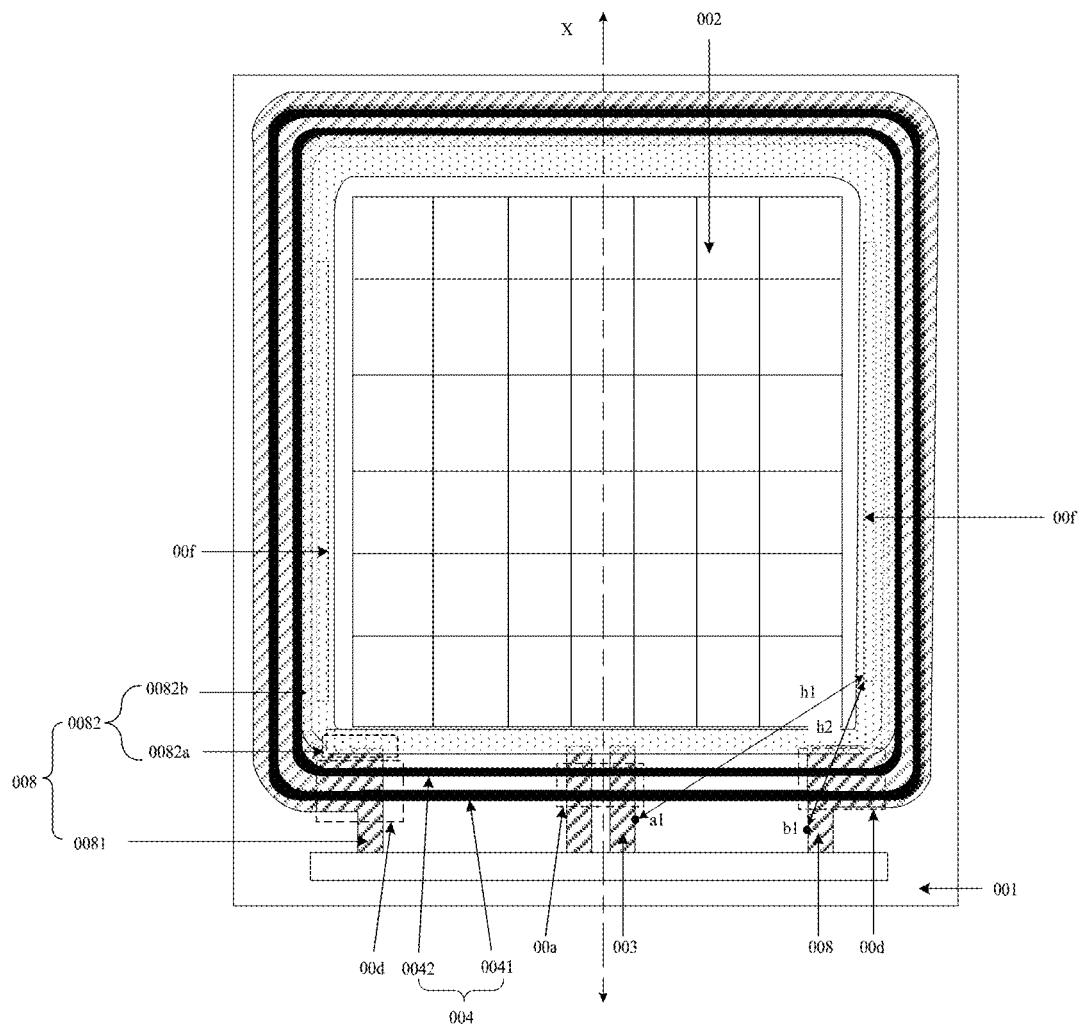
FIG. 6 is a schematic structural diagram of still another display substrate according to an embodiment of the present disclosure.

By covering the second side surface 005b of the auxiliary connection structure 005 with the blocking structure 004, the area of the base substrate 001 occupied by the auxiliary connection structure 005 and the blocking structure 004 can be reduced, facilitating the realization of a narrow-frame display substrate. Moreover, as the second projection region 005d of the auxiliary connection structure 005 has a longer distance from the first portion 0081 of the at least one second power line 008. Referring to FIG. 6, at a position distal from a second line inlet port 00d, a long entrance path is formed for the moisture, even if the second side surface 005b of the auxiliary connection structure 005 is covered by the blocking structure 004, the moisture cannot enter the pixel units 002.

Referring to FIGS. 1, 3 and 6, the auxiliary connection structure 005 may be in a ring construction surrounding the plurality of pixel units 002, so as to facilitate the cathode layer 006 to be connected to the at least one first power line 003 through the auxiliary connection structure 005, thereby guaranteeing the uniformity of potential of the power signal provided to the pixel units 002 of the display substrate, and achieving a good display effect.

Optionally, referring to FIG. 1, the end 003a of the at least one first power line 003 may be located in a middle of the side of the blocking structure 004 distal from the plurality of pixel units 002, for example, in the middle of the bonding region 00e.

The middle is a position where the longitudinal axis X of the base substrate passes through, and the longitudinal axis X is an axis parallel to the data line on the base substrate 001. A distance between the longitudinal axis X and one side of the display substrate is approximately equal to a distance between the longitudinal axis X and the other side of the display substrate. The one side and the other side are approximately parallel to an extension direction of the data line. For example, an included angle between any one of the two sides of the display substrate approximately parallel to the extension direction of the data line and the extension direction of the data line ranges from 0 degree to 10 degrees.

It should be noted that, "approximately" in the embodiments of the present disclosure refers to that an error range within 15% is allowed. If the distances are "approximately" equal to each other, then a difference between the two distances is no more than 15%. If the extension directions are "approximately" parallel to each other, then the included angle of the two extension directions is between 0 degree and 30 degrees, such as 0 degree to 10 degrees, 0 degree to 15 degrees and so on. If the shapes are "approximately" the same with each other, then the two shapes are of the same type, such as a rectangle, a polyline, an arc, a strip, an "L" type and so on. If the areas are "approximately" the same, then a difference between the two areas does not exceed 15%, etc.

Exemplarily, referring to FIG. 1, the display substrate may include two first power lines 003. The two first power lines 003 may be adjacently arranged in the middle of the side of the blocking structure 004 distal from the plurality of pixel units 002. Optionally, the two first power lines 003 are arranged in the middle of the side of the blocking structure 004 away from the plurality of pixel units 002, and are spaced from each other to be symmetrical with each other with respect to the longitudinal axis X of the base substrate as a symmetric axis. The arranging positions of the first power lines 003 are not limited in the embodiment of the present disclosure.

When the two first power lines 003 are adjacently arranged in the middle of the side of the blocking structure 004 distal from the plurality of pixel units 002, the two first power lines 003 may be formed to be a structure formed integrally.

Exemplarily, when the two first power lines 003 are formed integrally, that is, when there is one first power line 003, one end 003a of the first power line 003 is located in the middle of the side of the blocking structure 004 distal from the plurality of pixel units 002, for example, located in the middle of the bonding region 00e, so that the distance from the end 003a of the first power line 003 to the longitudinal axis X is less than the distance from the end 003a of the first power line 003 to any side of the two sides approximately parallel to the longitudinal axis X of the display substrate.

It should be noted that when the display substrate provided by the embodiments of the present disclosure is a foldable panel, a folding line of the foldable panel may be perpendicular to the longitudinal axis X. For example, the folding line of the foldable panel may be a perpendicular bisector of the longitudinal axis X.

Referring to FIG. 1, it can further be seen that the display substrate may further include: at least one second power line 008. The at least one second power line 008 may include a first portion 0081 and a second portion 0082. The first portion 0081 may be located on the side of the blocking structure 004 distal from the plurality of pixel units 002, and is configured for receiving a power signal. For example, the first portion 0081 may be connected with a driving chip and configured for receiving a power signal provided by the driving chip. The second portion 0082 may be connected with the cathode layer 006 through the auxiliary connection structure 005.

FIG. 5 is a local schematic structural diagram of the display substrate shown in FIG. 1. Referring to FIGS. 1 and 5, the second portion 0082 may include a first junction 0082a and a second junction 0082b which are both connected with the blocking structure 004, and a distance between the first junction 0082a and the blocking structure 004 may be greater than a distance between the second junction 0082b and the blocking structure 004. That is, the first junction 0082a of the second portion 0082 of the at least one second power line 008 is not in contact with the blocking structure 004. In an example, an orthographic projection of the first junction 0082a on the base substrate 001 and an orthographic projection of the blocking structure 004 on the base substrate 001 do not overlap; and the second junction 0082b may be located within a region covered by the blocking structure 004, for example, the second junction 0082b may be in contact with the blocking structure 004.

Optionally, as shown in FIG. 1, the display substrate may further have a bonding region 00e, which may be located on the side of the blocking structure distal from the plurality of pixel units 002. The first junction 0082a is closer to the bonding region 00e than the second junction 0082b is. Here, "being closer" means that the shortest distance between the respective points of the first junction 0082a and the bonding region 00e is greater than the shortest distance between the respective points of the second junction 0082b and the bonding region 00e.

Here, each junction of the first junction 0082a and the second junction 0082b may refer to: a portion of the second portion 0082 of the second power line 008 which is in contact with the auxiliary connection structure 005. In the embodiments of the present disclosure, the junction may refer to a portion of the second portion 0082 which is in direct contact with the auxiliary connection structure 005. The shapes of the two junctions may be substantially the same as the shape of the region where the orthographic projection of the second portion 0082 on the base substrate 001 and the orthographic projection of the auxiliary connection structure 005 on the base substrate 001 overlap.

In at least one embodiments of the present disclosure, the second power line 008 may include two first portions 0081. The two first portions 0081 may be substantially symmetrically disposed, with respect to the longitudinal axis X of the base substrate 001, around an edge of a side of the blocking structure 004 distal from the plurality of pixel units 002.

In at least one embodiment of the present disclosure, the second power line 008 may include two first portions 0081. For example, the two first portions 0081 may be located on two sides of the longitudinal axis X respectively, such as at two sides of the bonding region 00e.

In at least one embodiment of the present disclosure, the second power line 008 may include two first portions 0081. For example, the part of the two first portions 0081 which are near the second line inlet port 00d are respectively located at two sides of the display substrate, in another example, respectively proximal to two side edges that are parallel to the longitudinal axis X. Here, the second line inlet port 00d may be a portion of the blocking structure 004 for allowing the second power line 008 to pass through.

In at least one embodiment of the present disclosure, both the first power line 003 in the middle and the second power line 008 at the edge provide the power signal to the cathode layer 006 in the display substrate at the same time, so as to further alleviate the problem that a potential difference of the power signal loaded to the cathode layers 006 in different regions is large due to voltage drop. As such, the cathode layer 006 has good long range uniformity (LRU) and an improved display effect.

In at least one embodiment of the present disclosure, both the first power line 003 in the middle and the second power line 008 at the edge provide the power signal to the cathode layer 006 in the display substrate. At the same time, even if the number of the first power line 003 in the middle is increased, the design of the first power line 003 in the embodiments of the present disclosure can favorably mitigate the moisture and oxygen erosions and guarantee a good encapsulation performance.

It should be noted that, for a display substrate with a large size, more first power lines 003 may be provided. By providing the power signal for the cathode layer 006 through more first power lines 003, the uniformity of potential in respective regions of the cathode layer 006 can be guaranteed and the display substrate can achieve an improved display effect.

It should also be noted that, in the embodiments of the present disclosure, as both the first power line 003 and the second power line 008 are configured to provide the power signal to the cathode layer 006, both the first power line 003 and the second power line 008 may be referred to as a VSS power line or a VSS wire.

Referring to FIGS. 3 and 6, the display substrate may further include: a row driving region 00f located between the blocking structure 004 and the plurality of pixel units 002. A distance between the row driving region 00f and the orthographic projection of the at least one first power line 003 on the base substrate 001 may be greater than a distance between the row driving region 00f and the orthographic projection of the at least one second power line 008 on the base substrate. For example, the distance between the at least one first power line 003 located in the middle and the row driving region 00f may be longer than the distance between the at least one second power line 008 and the row driving region 00f.

Or, it can be understood that, the shortest distance between respective portions of each first power line 003 and the row driving region 00f is greater than the shortest distance between respective portions of each second power line 008 and the row driving region 00f. For example, referring to FIG. 6, the distance h1 between a point a1 of the at least one first power line 003 and the row driving region 00f is greater than the distance h2 between a point b1 of the at least one second power line 008 and the row driving region 00f.

Here, the row driving region 00f may be provided with a plurality of cascaded shift register units, which may be configured to drive each row of the pixel units 002.

Exemplarily, as shown in FIGS. 3 and 6, the display substrate may have two row driving regions 00f, which are respectively arranged on two sides of the plurality of pixel units 002 and are symmetrically arranged with the longitudinal axis X of the base substrate 001 as the symmetrical axis.

Figure 7:
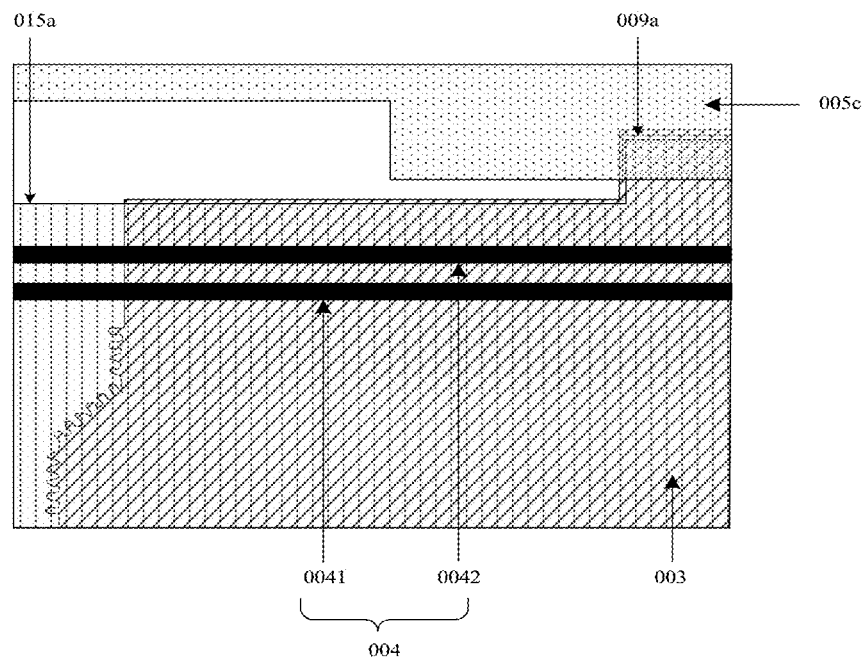
FIG. 7 is a local schematic structural diagram of another display substrate according to an embodiment of the present disclosure.

In the embodiments of the present disclosure, referring to FIG. 2, the display substrate may further include: a passivation layer 009 which may cover the at least one first power line 003. FIG. 7 is a local schematic structural diagram of another display substrate according to an embodiment of the present disclosure. Referring to FIGS. 2 and 7, the passivation layer 009 is further provided with an opening 009a; a side of the auxiliary connection structure 005 proximal to the base substrate 001 is connected with the at least one first power line 003 through the opening 009a, and a side of the auxiliary connection structure 005 distal from the base substrate 001 is connected with the cathode layer 006. Here, the reference 009a shown in FIG. 7 is an opening provided in the passivation layer 009. That is, in FIG. 7, except the region where the opening 009a is located, all other regions are covered by the passivation layer 009.

As the at least one first power line 003 is easy to be eroded by moisture or oxygen during the manufacturing of the display substrate, by covering the at least one first power line 003 with the passivation layer 009, it can be guaranteed that when other layers are formed subsequently, the at least one first power line 003 would not be eroded by moisture or oxygen, thereby guaranteeing that the at least one first power line 003 can provide the power signal to the cathode layer 006, so as to ensure the display effect of the display substrate.

In the embodiments of the present disclosure, the opening in the passivation layer 009 may be a via hole or may be a slot, which is not limited in the embodiments of the present disclosure. The material for manufacturing the passivation layer 009 may include: one or more of inorganic oxides such as SiNx (silicon nitride), SiOx (silicon oxide) and SiOxNy (silicon oxynitride). The material for manufacturing the passivation layer 009 is not limited by the embodiments of the present disclosure.

It should be noted that, in the embodiments of the present disclosure, the passivation layer 009 may further cover the at least one second power line 008, thereby guaranteeing that the at least one second power line 008 would not be eroded by moisture or oxygen, so as to ensure the display effect of the display substrate.

In the embodiments of the present disclosure, referring to FIGS. 1, 3 and 6, the blocking structure 004 may in a ring construction surrounding the plurality of pixel units 002 to block the overflow of an organic layer in the region surrounded by the blocking structure 004 of the display substrate. With reference to FIGS. 1 and 7, the blocking structure 004 may include: a first blocking dam 0041 and a second blocking dam 0042. The first blocking dam 0041 is farther away from the plurality of pixel units 002 than the second blocking dam 0042 is, and the thickness of the first blocking dam 0041 is greater than the thickness of the second blocking dam 0042.

By arranging the two blocking dams, wherein the thickness of the first blocking dam 0041 distal from the plurality of pixel units 002 is greater than the thickness of the second blocking dam 0042 proximal to the plurality of pixel units 002, the overflow of the organic layer in the region surrounded by the blocking structure 004 can be further prevented. Of course, the blocking structure 004 may further include one blocking dam, or more than two blocking dams, which is not limited in the embodiments of the present disclosure.

Figure 8:
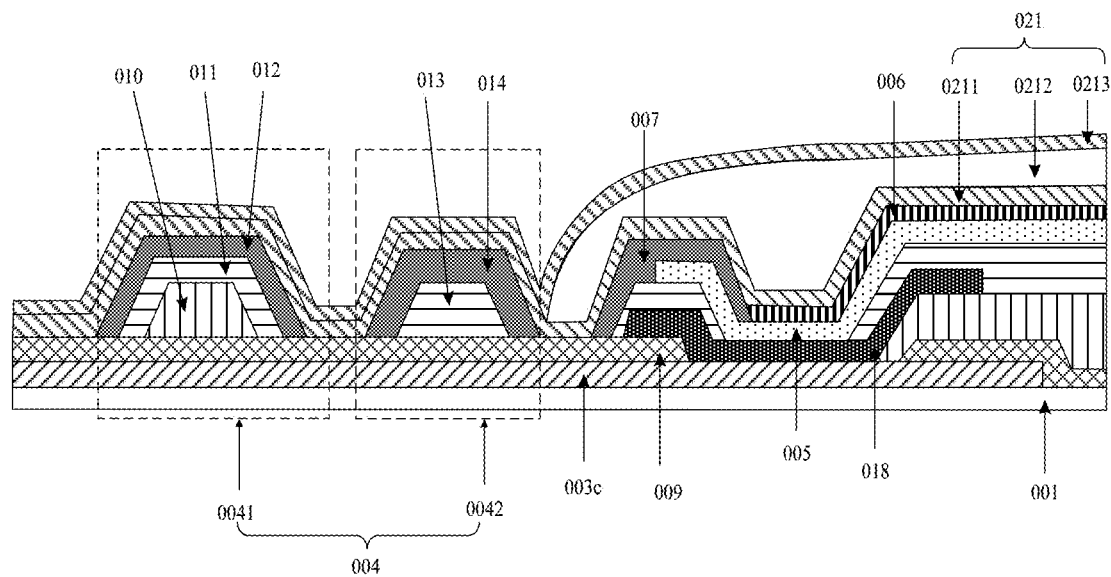
FIG. 8 is a schematic structural diagram of still another display substrate according to an embodiment of the present disclosure.

As an optional implementation, FIG. 8 is a schematic structural diagram of still another display substrate according to an embodiment of the present disclosure. Referring to FIG. 8, the first blocking dam 0041 may include: a first planarization layer pattern 010, a second planarization layer pattern 011 and a second organic pattern 012 which are disposed along a direction away from the base substrate 001. The second blocking dam 0042 may include: a third planarization layer pattern 013 and a third organic pattern 014 which are arranged along a direction away from the base substrate 001.

Here, the second planarization layer pattern 011 and the third planarization layer pattern 013 may include a same material; and the first organic pattern 007, the second organic pattern 012 and the third organic pattern 014 may include a same material. For example, the second planarization layer pattern 011 and the third planarization layer pattern 013 may employ the same material and may be prepared from a same patterning process; and the first organic pattern 007, the second organic pattern 012 and the third organic pattern 014 may employ the same material and may be prepared from a same patterning process.

In the embodiments of the present disclosure, the first planarization layer pattern 010 may belong to the first planarization layer; the second planarization layer pattern 011 and the third planarization layer pattern 013 may belong to the second planarization layer; and the first organic pattern 007, the second organic pattern 012 and the third organic pattern 014 may belong to the first organic layer which may be a pixel definition layer (PDL).

Optionally, the materials for manufacturing the first planarization layer, the second planarization layer and the first organic layer may include: organic materials such as resins. This is not limited in the embodiments of the present disclosure.

As another optional implementation, referring to FIG. 2, the first blocking dam 0041 may include: a planarization layer pattern 015 and a second organic pattern 012 which are sequentially arranged in layers along a direction away from the base substrate 001. The second blocking dam 0042 may include: a third organic pattern 014 disposed on the base substrate 001.

Here, the first organic pattern 007, the second organic pattern 012 and the third organic pattern 014 may include a same material. For example, the first organic pattern 007, the second organic pattern 012 and the third organic pattern 014 may employ the same material and may be prepared from a same patterning process.

In the embodiments of the present disclosure, the planarization layer pattern 015 may belong to the planarization layer; and the first organic pattern 007, the second organic pattern 012 and the third organic pattern 014 may belong to the first organic layer.

Optionally, the materials for manufacturing the planarization layer may include: organic materials such as resins. This is not limited in the embodiments of the present disclosure.

It should be noted that the opening 015a shown in FIG. 7 is a region not covered by the planarization layer pattern 015. For example, in the regions shown in FIG. 7, except the region where the opening 015a is located, all other regions of the base substrate 001 are covered with the planarization layer pattern 015. As can be seen from FIG. 7, the planarization layer pattern 015 may cover a boundary of a portion of the first power line 003 located in the region surrounded by the blocking structure 004.

With reference to FIGS. 2 and 7, for an overlapping region formed by the first projection region 005c and the orthographic projection of the at least one first power line 003 on the base substrate 001, the region where the overlapping region and the orthographic projection of the opening 009a of the planarization layer 009 on the base substrate 001 overlap, may cover the region where the overlapping region and the orthographic projection of the opening 015a of the planarization layer pattern 015 on the base substrate 001 overlap. That is, in the overlapping region, the size of the opening 009a of the planarization layer 009 is greater than the size of the opening 015a of the planarization layer pattern 015.

As can be seen by referring to FIGS. 2 and 8, the first blocking dam 0041 has one more planarization layer pattern than the second blocking dam 0042, so that the thickness of the first blocking dam 0041 is greater than the thickness of the second blocking dam 0042, which prevents the overflow of the organic layer.

Figure 9:
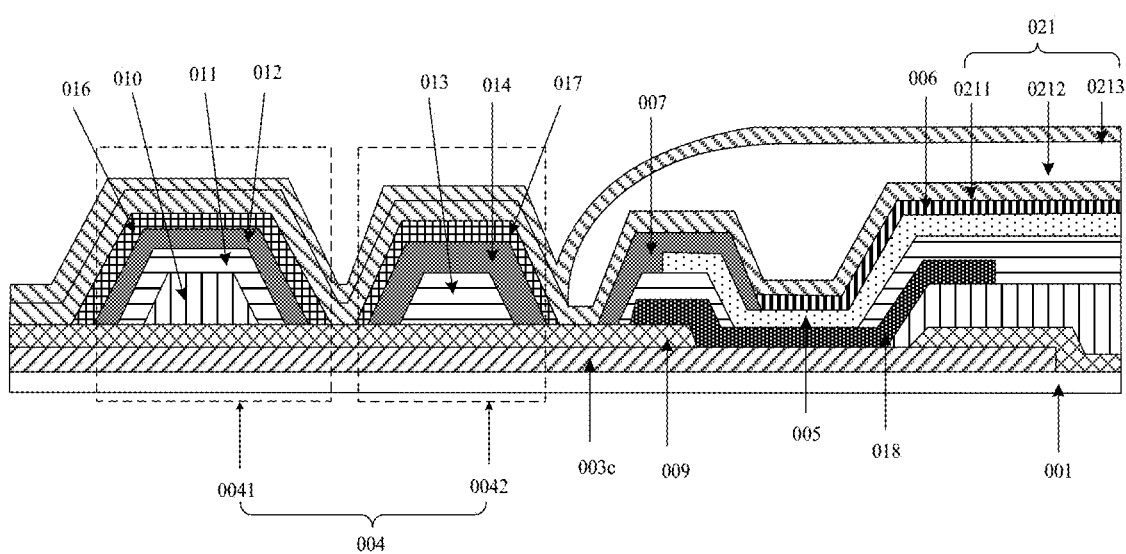
FIG. 9 is a schematic structural diagram of still another display substrate according to an embodiment of the present disclosure.

FIG. 9 is a schematic structural diagram of still another display substrate according to an embodiment of the present disclosure. As can be seen from FIG. 9, the first blocking dam 0041 may further include: a fourth organic pattern 016 disposed on a side of the second organic pattern 012 distal from the base substrate 001. The second blocking dam 0042 may further include: a fifth organic pattern 017 disposed on a side of the third organic pattern 014 distal from the base substrate 001.

Here, the fourth organic pattern 016 and the fifth organic pattern 017 may include a same material. For example, the fourth organic pattern 016 and the fifth organic pattern 017 may employ the same material and may be prepared from a same patterning process. Moreover, both the fourth organic pattern 016 and the fifth organic pattern 017 may belong to the second organic layer, which may be a photo spacer (PS).

Optionally, the materials for manufacturing the second organic layer may include: organic materials such as resins. This is not limited in the embodiments of the present disclosure.

Figure 10:
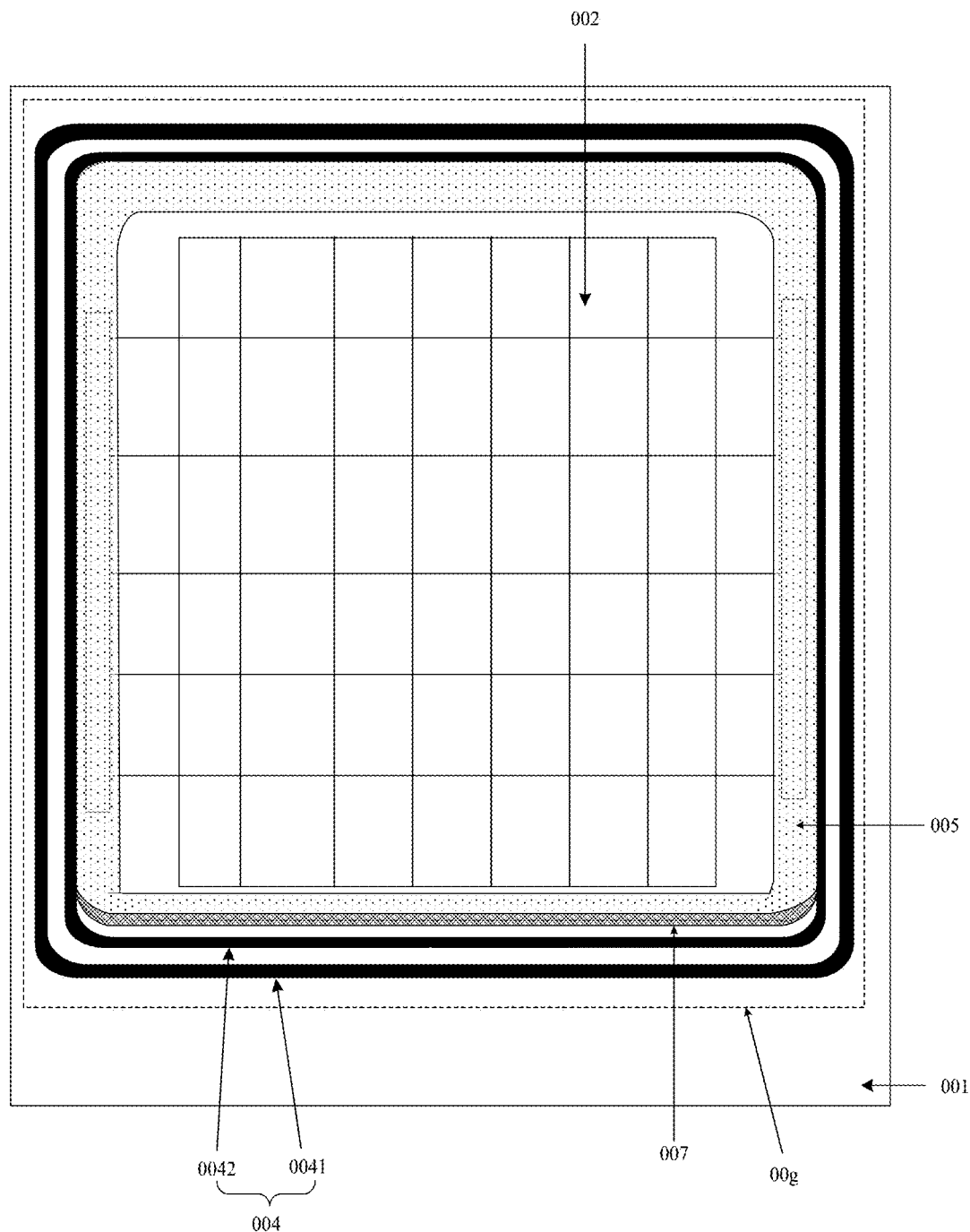
FIG. 10 is a schematic structural diagram of still another display substrate according to an embodiment of the present disclosure.

FIG. 10 is a schematic structural diagram of still another display substrate according to an embodiment of the present disclosure. As can be seen by referring to FIG. 10, the first organic pattern 007 may cover the second side surface 005b of the auxiliary connection structure 005. Referring to FIGS. 1, 3, 6 and 10, the first blocking dam 0041 may be a first ring, and the second blocking dam 0042 may be a second ring. The first organic pattern 007 and a portion of the third organic pattern 014 may define a third ring. An orthographic projection of the third ring on the base substrate 001 may be located inside an orthographic projection of the second ring on the base substrate 001, and the orthographic projection of the second ring on the base substrate 001 may be located inside an orthographic projection of the first ring on the base substrate 001. Here, the third ring may surround the plurality of pixel units 002. The shape of the third organic pattern 014 may be substantially the same as that of the second blocking dam 0042, that is, the third organic pattern 014 may also be ring-shaped.

The portion of the third organic pattern 014 may be a portion of the third organic pattern 014 located on the side of the first organic pattern 007 proximal to the plurality of pixel units 002. For example, referring to FIG. 10, the portion of the third organic pattern 014 may be the left portion, the upper portion, and the right portion of the third organic pattern 014.

Figure 11:
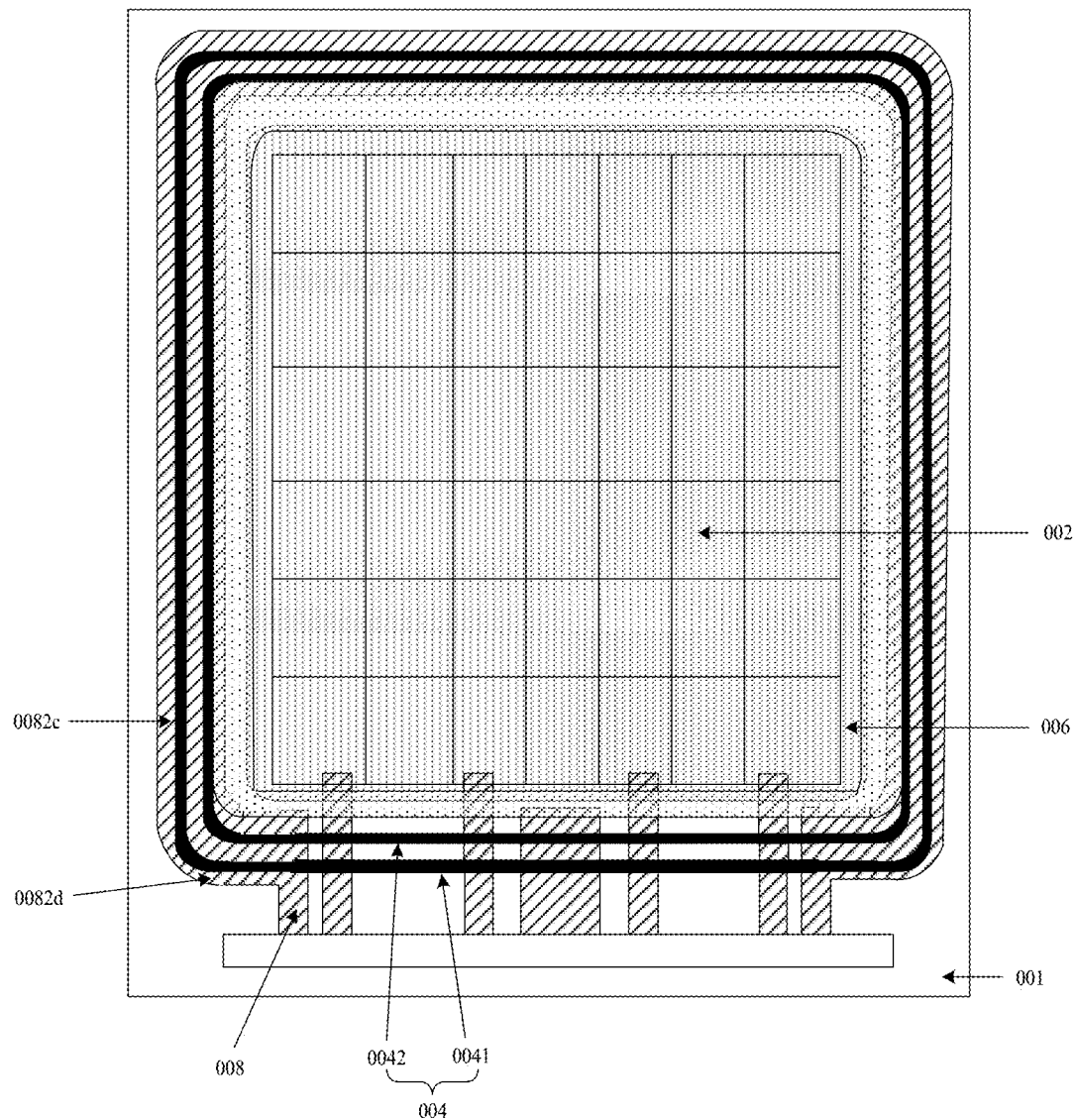
FIG. 11 is a schematic structural diagram of still another display substrate according to an embodiment of the present disclosure.

In the embodiments of the present disclosure, the first organic pattern 007 may include a portion which is in direct contact with the second blocking dam 0042. Referring to FIGS. 1, 6 and 11, the second power line 008 may include two first portions 0081 and one second portion 0082. The two first portions 0081 may be symmetrically disposed on two sides of the base substrate 001 with respect to the longitudinal axis X of the base substrate 001. For example, the part of the two first portions 0081 near the second line inlet port 00d may be located on two sides of the display substrate, and in another example, may be respectively located close to each of the two side edges that are parallel to the longitudinal axis X. Here, FIG. 6 shows the second line inlet port 00d of the two first portions 0081. The second portion 0082 may surround the plurality of pixel units 002, and the two ends of the second portion 0082 may be connected with one first portion 0081 respectively.

In at least one embodiment of the present disclosure, the first portion 0081 and the second portion 0082 may be in direct contact, for example, may be formed integrally.

In at least one embodiment of the present disclosure, the second power line 008 may include: a straight portion 0082c and an arc-shaped portion 0082d which surround a region where the plurality of pixel units 002 are located.

In at least one embodiment of the present disclosure, the second portion 0082 may include: a straight portion 0082c and an arc-shaped portion 0082d which surround a region where the plurality of pixel units 002 are located. Furthermore, the second portion 0082 of the second power line 008 may include a non-enclosed structure. The embodiments of the present disclosure take the second portion 0082 at least surrounding two edges of the display substrate as an example for description. An orthographic projection of a portion, in direct contact with the second blocking dam 0042, of the first organic pattern 007 on the base substrate 001 may be located within an orthographic projection of the arc-shaped portion 0082d on the base substrate 001. That is, the orthographic projection of the portion, which is in direct contact with the second blocking dam 0042, of the first organic pattern 007 on the base substrate 001 does not go outside of the orthographic projection of the arc-shaped portion 0082d on the base substrate 001.

In at least one embodiment of the present disclosure, the arc-shaped portion 0082d is closer to the first portion 0081 of the at least one second power line 008 for receiving the power signal than the straight portion 0082c is.

As an optional implementation, referring to FIG. 8, the at least one first power line 003 may include: a first metal layer 003c. The display substrate may further include: an auxiliary metal layer 018 on a side of the first metal layer 003c distal from the base substrate 001.

In at least one embodiment of the present disclosure, a side of the auxiliary metal layer 018 distal from the first metal layer 003c may be in contact with the auxiliary connection structure 005, and an orthographic projection of the auxiliary metal layer 018 on the base substrate 001 and the orthographic projection of the blocking structure 004 on the base substrate 001 do not overlap. For example, the orthographic projection of the auxiliary metal layer 018 on the base substrate 001 includes a portion which is within a region surrounded by the orthographic projection of the blocking structure 004 on the base substrate 001.

Figure 12:
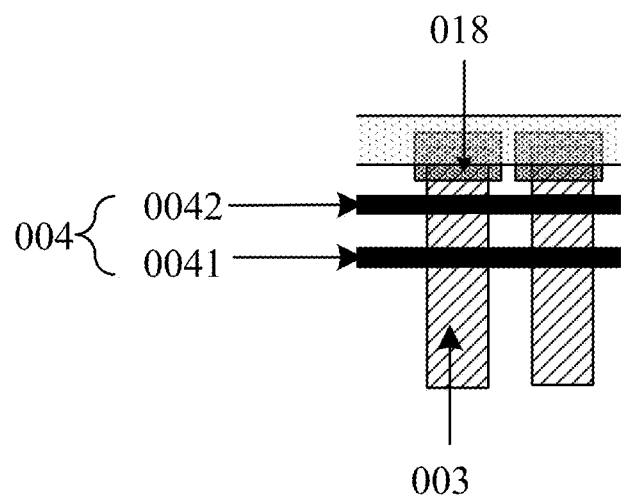
FIG. 12 is a local schematic structural diagram of still another display substrate according to an embodiment of the present disclosure.

FIG. 12 is a local schematic structural diagram of still another display substrate according to an embodiment of the present disclosure. Referring to FIG. 12, the orthographic projection of the auxiliary metal layer 018 on the base substrate 001 includes a portion which is within a region surrounded by the orthographic projection of the second blocking structure 0042 on the base substrate 001.

In at least one embodiment of the present disclosure, the side of the first metal layer 003c distal from the base substrate 001 is not provided with the auxiliary metal layer 018 in the region where the blocking structure 004 is located. That is, in the region where the blocking structure 004 is located, the auxiliary metal layer 018 is removed. That is, in the region where the first line inlet port 00a is located, the auxiliary metal layer 018 is removed. For example, the side of the blocking structure 004 distal from the plurality of pixel units 002 may be provided with an auxiliary metal layer 018; and the region surrounded by the blocking structure 004 may also be provided with an auxiliary metal layer 018.

The shape of a boundary of the auxiliary metal layer 018 may be substantially the same as the shape of a boundary of the first metal layer 003c, or the shape of the boundary of the auxiliary metal layer 018 may also be different from the shape of the boundary of the first metal layer 003c. This is not limited in the embodiments of the present disclosure.

Here, the power signal received by the first metal layer 003c may be transmitted to the auxiliary connection structure 005 through the auxiliary metal layer 018 disposed in the opening of the passivation layer 009. The power signal is transmitted to the cathode layer 006 through the auxiliary connection structure 005.

In at least one embodiment of the present disclosure, referring to FIG. 8, the side of the auxiliary metal layer 018 distal from the base substrate 001 may be covered, at portions close to the edges and at the side edges, by a second planarization layer including the second planarization layer pattern 011 and the third planarization layer pattern 013; and the second planarization layer can be configured to avoid display defects caused by etching defects on the sidewalls of the auxiliary metal layer 018.

As the organic material for manufacturing the second planarization layer is typically a hydrophilic material, therefore, in order to prevent the auxiliary metal layer 018 from introducing moisture into the pixel units 002, the orthographic projection of the auxiliary metal layer 018 on the base substrate 001 and the orthographic projection of the blocking structure 004 on the base substrate 001 can be configured to have no overlapped region, such that the moisture can be prevented from entering inside from the blocking structure 004 and entering the region where the pixel units 002 are located along the path formed by the second planarization layer, thereby guaranteeing the display effect of the display substrate.

Figure 13:
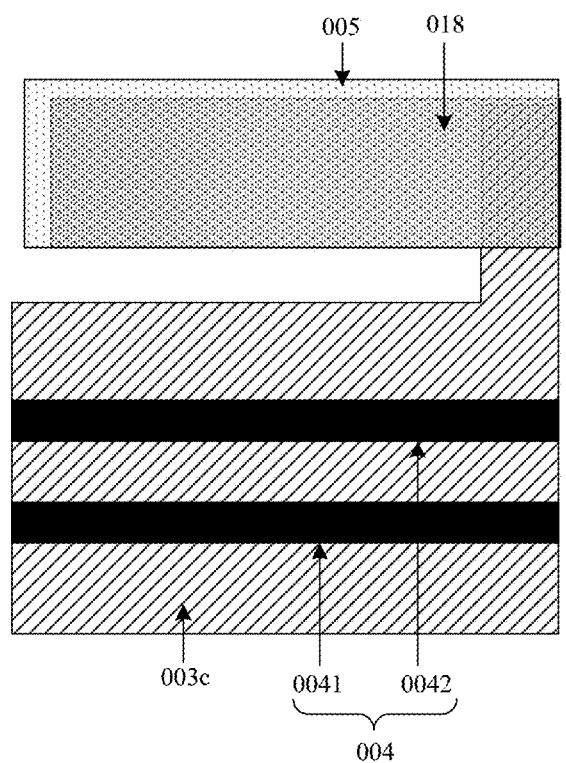
FIG. 13 is a local schematic structural diagram of still another display substrate according to an embodiment of the present disclosure.
Figure 14:
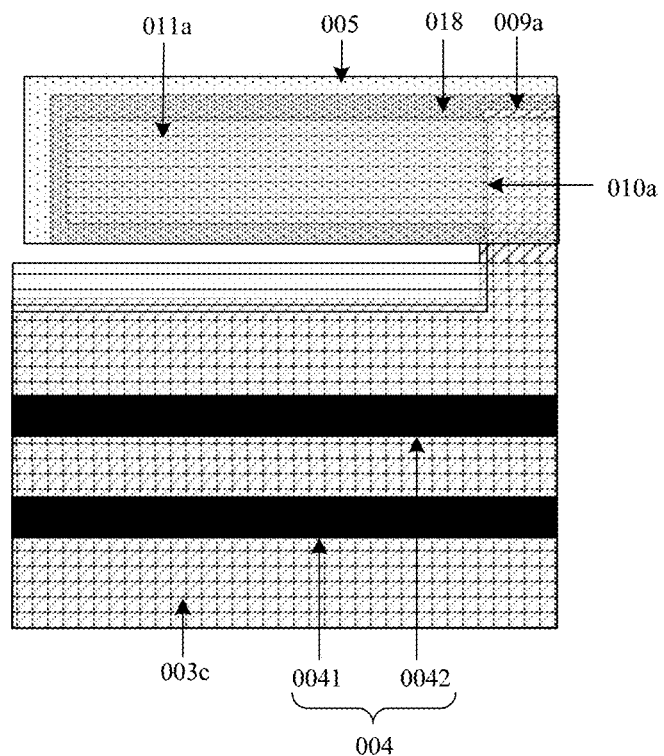
FIG. 14 is a local schematic structural diagram of still another display substrate according to an embodiment of the present disclosure.

FIG. 13 is a local schematic structural diagram of still another display substrate according to an embodiment of the present disclosure. As can be seen by referring to FIG. 13, the orthographic projection of a portion of the auxiliary metal layer 018 in contact with the first metal layer 003c, on the base substrate 001, may be located within the orthographic projection of the auxiliary metal layer 018 on the base substrate 001, so that a distance is presented between the boundary of the first metal layer 003c and the boundary of the auxiliary metal layer 018. Thus, the first metal layer 003c and the auxiliary metal layer 018 can be prevented from being eroded by the moisture or oxygen. FIG. 14 is a local schematic structural diagram of still another display substrate according to an embodiment of the present disclosure. The reference 010a shown in FIG. 14 illustrates an opening provided in the first planarization layer. That is, in FIG. 14, except the region where the opening 010a is located, all other regions are covered with the first planarization layer. The reference 011a shown in FIG. 14 illustrates an opening provided in the second planarization layer. That is, in FIG. 14, except the region where the opening 011a is located, all other regions are covered with the second planarization layer.

In the implementation, the first metal layer 003c, the passivation layer 009, the first planarization layer pattern 010, the auxiliary metal layer 018, the second planarization layer pattern 011 and the first organic pattern 007 of the display substrate may be arranged in layers along a direction away from the base substrate 001. That is, the first power line 003, the passivation layer 009, the first planarization layer, the auxiliary metal layer 018, the second planarization layer and the first organic layer of the display substrate may be arranged in layers along the direction of the base substrate 001.

It should be noted that both the first metal layer 003c and the auxiliary metal layer 018 may include three metal film layers. For example, the materials of the three metal film layers may sequentially be: titanium (Ti), aluminum (Al) and Ti.

Figure 15:
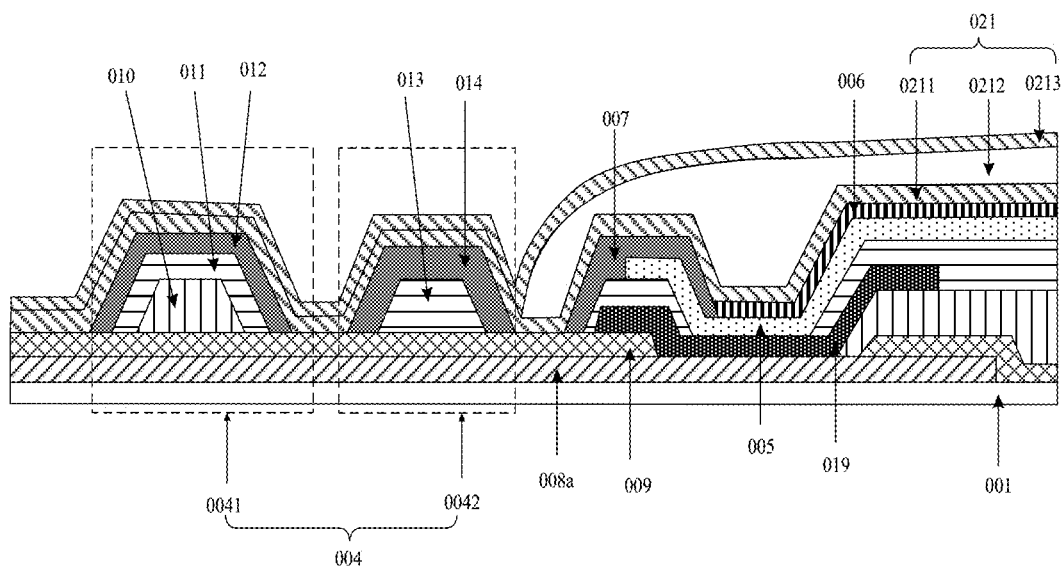
FIG. 15 is a sectional view of the display substrate shown in FIG. 1 taken along a direction of CC.

It should also be noted that FIG. 15 is a sectional view of the display substrate shown in FIG. 1 taken along a direction of CC. Referring to FIG. 15, the at least one second power line 008 may include: a second metal layer 008a. The display substrate may further include: an auxiliary wiring layer 019 on a side of the second metal layer 008a distal from the base substrate 001.

In at least one embodiment of the present disclosure, a side of the auxiliary wiring layer 019 distal from the second power line 008 is in contact with the auxiliary connection structure 005, and an orthographic projection of the auxiliary wiring layer 019 on the base substrate 001 and the orthographic projection of the blocking structure 004 on the base substrate 001 does not overlap. For example, the orthographic projection of the auxiliary wiring layer 019 on the base substrate 001 may include a portion which is within the orthographic projection of the blocking structure 004 on the base substrate 001.

Figure 16:
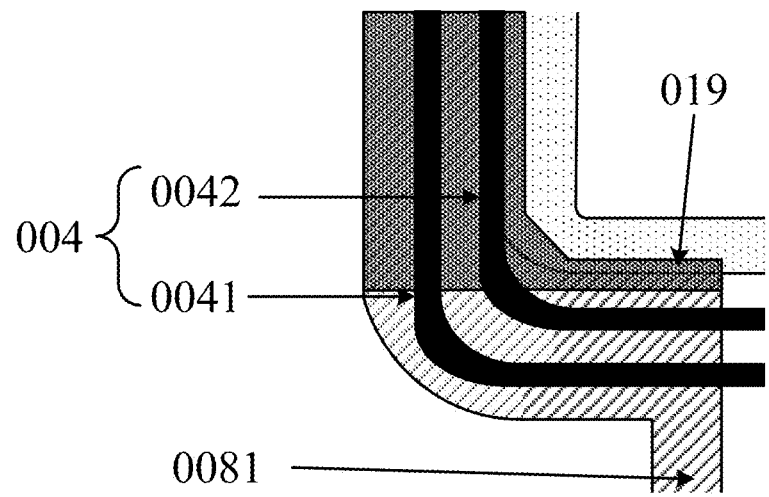
FIG. 16 is a local schematic structural diagram of still another display substrate according to an embodiment of the present disclosure.

FIG. 16 is a local schematic structural diagram of still another display substrate according to an embodiment of the present disclosure. Referring to FIG. 16, the orthographic projection of the auxiliary wiring layer 019 on the base substrate 001 may have a portion which is within the orthographic projection of the second blocking structure 0042 on the base substrate 001.

In at least one embodiment of the present disclosure, the side of the second metal layer 008a distal from the base substrate 001 is not provided with the auxiliary wiring layer 019 in the region where the blocking structure 004 is located. That is, in the region where the blocking structure 004 is located, the auxiliary wiring layer 01 is removed. That is, in the region where the second line inlet port 00d is located, the auxiliary wiring layer 019 is removed. For example, the side of the blocking structure 004 distal from the plurality of pixel units may be provided with the auxiliary wiring layer 019; and the region included in the blocking structure 004 may be provided with the auxiliary wiring layer 019.

The shape of a boundary of the auxiliary wiring layer 019 may be substantially the same as the shape of a boundary of the second metal layer 008a, or the shape of the boundary of the auxiliary wiring layer 019 may be different from the shape of the boundary of the second metal layer 008a. This is not limited in the embodiments of the present disclosure.

Figure 17:
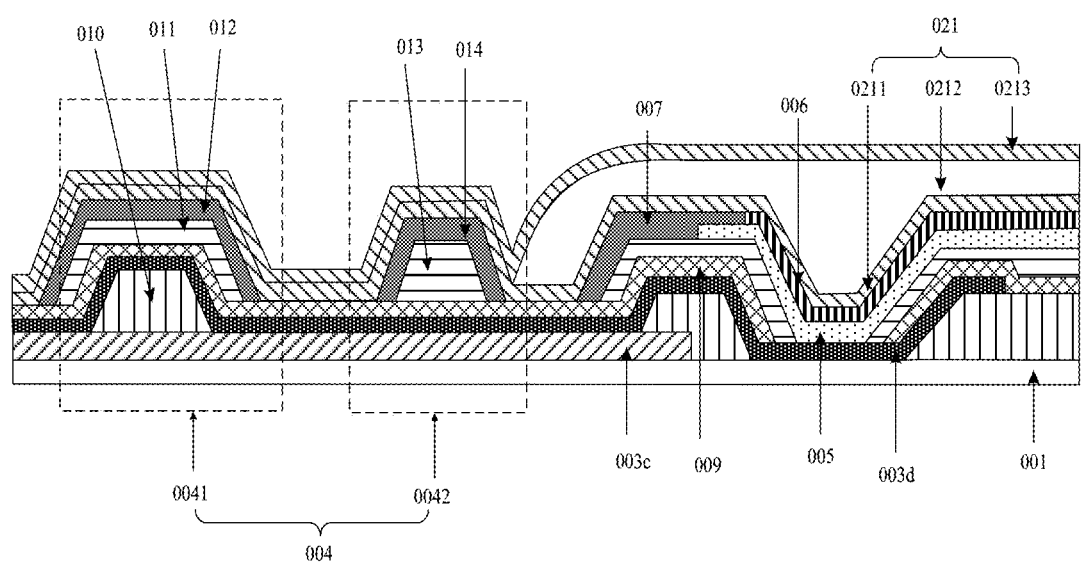
FIG. 17 is a schematic structural diagram of still another display substrate according to an embodiment of the present disclosure.

As another optional implementation, referring to FIG. 17, the at least one first power line 003 may include: a first metal layer 003c and a third metal layer 003d which are disposed along a direction away from the base substrate 001. A side of the third metal layer 003d distal from the first metal layer 003c is in contact with the auxiliary connection structure 005.

Both the orthographic projection of the first metal layer 003c on the base substrate 001 and the orthographic projection of the third metal layer 003d on the base substrate 001 may overlap with the orthographic projection of the blocking structure 004 on the base substrate 001. That is, the ends of both the first metal layer 003c and the third metal layer 003d distal from the plurality of pixel units 002 can be configured to receive the power signal, so that the power signal can be transmitted to the cathode layer 006 through both the first metal layer 003c and the third metal layer 003d. Therefore, the resistance can be reduced and the voltage drop of the power signal can be further reduced.

Referring to FIG. 17, the orthographic projection of the first metal layer 003c on the base substrate 001 and the region where the third metal layer 003d is in contact with the auxiliary connection structure 005 do not overlap.

Figure 18:
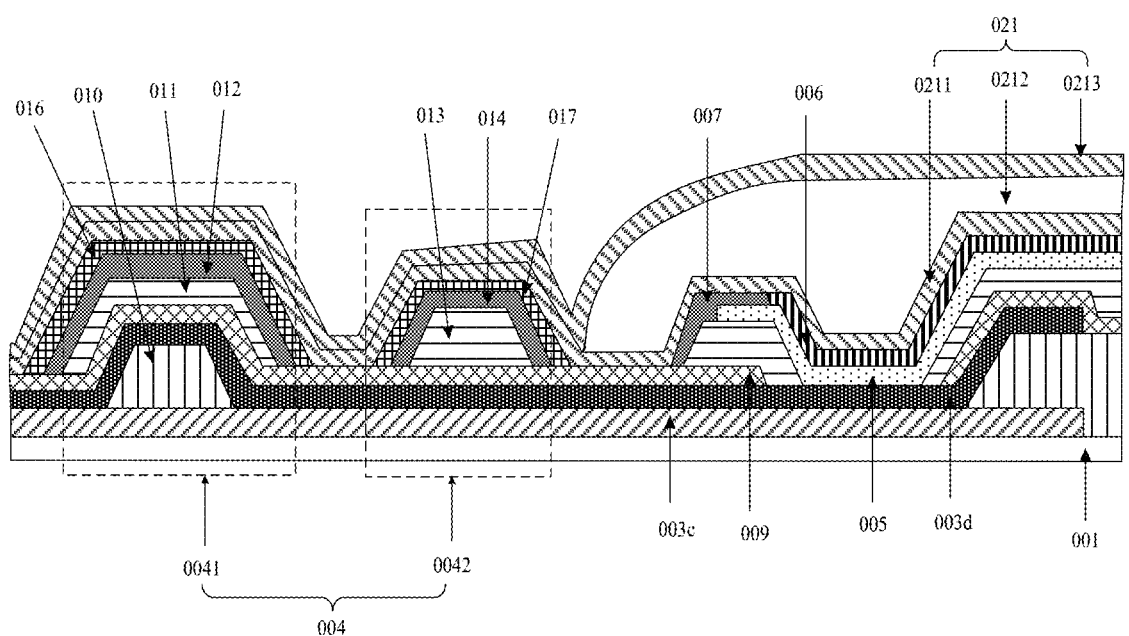
FIG. 18 is a schematic structural diagram of still another display substrate according to an embodiment of the present disclosure.

Or, referring to FIG. 18, the orthographic projection of the first metal layer 003c on the base substrate 001 may overlap with the region where the third metal layer 003d is in contact with the auxiliary connection structure 005.

Here, the first planarization layer may cover the other end of the first metal layer 003c proximal to the plurality of pixel units 002, so as to reduce the oxygen or moisture corrosions occurring on the other end of the first metal layer 003c, or to reduce the final display defects caused by the etching defects of the side surfaces of the metal layers.

Referring to FIGS. 17 and 18, the first metal layer 003c, the first planarization layer pattern 010, the third metal layer 003d, the passivation layer 009, the second planarization layer pattern 011 and the first organic pattern 007 of the display substrate may be arranged in layers along a direction away from the base substrate 001. That is, the first metal layer 003c, the first planarization layer, the third metal layer 003d, the passivation layer 009, the second planarization layer, and the first organic layer of the display substrate may be arranged in layers along the direction of the base substrate 001.

It should be noted that both the first metal layer 003c and the third metal layer 003d may include three metal film layers. For example, the materials of the three metal film layers may sequentially be: Ti, Al and Ti.

It should also be noted that, referring to FIGS. 9 and 18, when the first blocking dam 0041 further includes a fourth organic pattern 016 disposed on a side of the second organic pattern 012 distal from the base substrate, and the second blocking dam 0042 further includes a fifth organic pattern 017 disposed on a side of the third organic pattern 014 distal from the base substrate 001, the second organic layer including the fourth organic pattern 016 and the fifth organic pattern 017 can be disposed on a side of the first organic layer distal from the base substrate 001.

Figure 19:
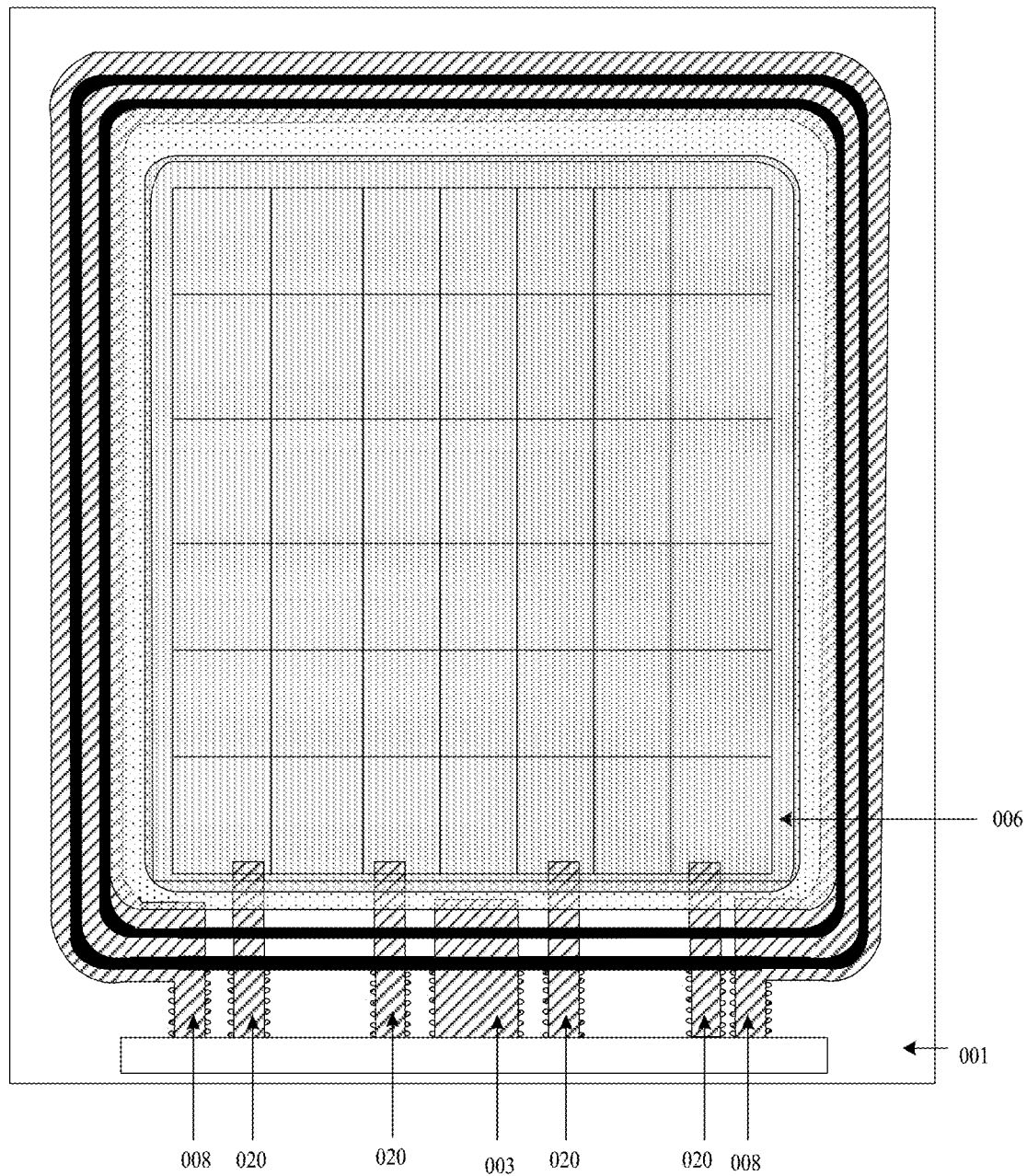
FIG. 19 is a schematic structural diagram of still another display substrate according to an embodiment of the present disclosure.

FIG. 19 is a schematic structural diagram of still another display substrate according to an embodiment of the present disclosure. Referring FIGS. 4 and 19, a plurality of tooth-shaped protruding structures are formed on a side surface of the at least one first power line 003 located on the side of the blocking structure 004 distal from the plurality of pixel units 002. Therefore, an entrance path of moisture can be further prolonged, and the moisture can be prevented from being introduced into the plurality of pixel units 002.

Referring to FIGS. 4 and 19, orthographic projections of the protruding structures on the base substrate 001 and the orthographic projection of the blocking structure 004 on the base substrate 001 do not overlap. Moreover, a side surface of the other end 003b of the at least one first power line 003 within the region surrounded by the blocking structure 004 may be flat. That is, no protruding structure is formed on the side surface of the other end 003b of the at least one first power line 003 within the region surrounded by the blocking structure 004.

When the display substrate is manufactured, the auxiliary connection structure 005 is obtained by sequential processes such as exposure, development, etching and other processes. In the etching process, an etchant is needed for etching a film layer. If the side surface of the other end 003b of the first power line 003 within the region surrounded by the blocking structure 004 is also configured to have tooth-shaped protruding structures, the etchant will be retained among the adjacent protruding structures of the first power line 003, so that the sidewall of the other end 003b of the first power line 003 will be corroded. Therefore, by configuring the side surface of the other end 003b of the first power line 003 within the region surrounded by the blocking structure 004 as a flat surface, the passivation layer 009 which is a brittle film on the side of the first power line 003 distal from the base substrate 001 can be prevented from being penetrated through, due to the corrosion on the sidewall of the first power line 003, in the process of manufacturing the display substrate. Thus, the quality of the passivation layer 009 can be guaranteed.

As also can be seen by referring to FIG. 19, a plurality of tooth-shaped protruding structures may also be formed on a side surface of an end, distal from the plurality of pixel units 002, of a first portion 0081 of the at least one second power line 008. Therefore, an entrance path of moisture along the second power line 008 can be prolonged, and the moisture can be prevented from being introduced into the plurality of pixel units 002. Furthermore, the side surface of the other end, within the region surrounded by the blocking structure 004, of the first portion 0081 of the at least one second power line 008 may be flat.

As can be seen by referring to FIG. 19, the display substrate may further include: a plurality of third power lines 020, which may be located on the base substrate 001. The plurality of third power lines 020 are electrically connected with transistors in the pixel units 002 of the display substrate. For example, the third power lines 020 may be respectively connected with a source electrode or a drain electrode of the transistors in the pixel units 002. The third power line 020 may be configured to provide a positive power signal to the transistor in the pixel units 002, such that the third power lines 020 may also be referred to as VDD power lines or a VDD wires.

In the embodiments of the present disclosure, the plurality of third power lines 020 may be symmetrically disposed on two sides of the at least one first power line 003. For example, referring to FIG. 19, the display substrate may include: four third power lines 020. Here, two of the third power lines 020 may be located in the middle of the side of the blocking structure 004 distal from the plurality of pixel units 002; and the two third power lines 020 may be symmetrically disposed on two sides of the first power line 003 with respect to the longitudinal axis X of the base substrate 001. The remaining two third power lines 020 may be both located at an edge of the side of the blocking structure distal from the plurality of pixel units 002. Each third power line 020 may be located on the side of one first portion 0081 of the second power line 008 proximal to the first power line 003.

As also can be seen by referring to FIG. 19, a plurality of tooth-shaped protruding structures may also be formed on side surfaces of the ends of the plurality of third power lines 020 that are located on the side of the blocking structure 004 distal from the plurality of pixel units 002, so that the paths of introducing moisture along the third power lines 020 are extended to avoid moisture from being introduced into the plurality of pixel units 002. Furthermore, the side surface of the other end of each of the third power lines 020 that is within the region surrounded by the blocking structure 004 may be flat.

As can be seen by referring to FIGS. 2, 8 to 9, 15, and 17 to 18, the display substrate may further include: an encapsulation film layer 021. The encapsulation film layer 021 may be located on a side of the plurality of first power lines distal from the base substrate 001, and the encapsulation film layer 021 may cover the region surrounded by the blocking structure 004.

In the embodiments of the present disclosure, the encapsulation film layer 021 may include: a first film layer 0211, a second film layer 0212 and a third film layer 0213 disposed in layers in a direction away from the base substrate 001.

Optionally, the first film layer 0211 and the third film layer 0213 may be made of inorganic materials, and the second film layer 0212 may be made of an organic material. For example, the first film layer 0211 and the third film layer 0213 may be made of one or more inorganic oxides such as SiNx, SiOx and SiOxNy. The second film layer 0212 may be made of a resin material. The resin material may be thermoplastic resin or a thermosetting resin. The thermoplastic resin may include acrylic (PMMA) resins, and the thermosetting resin may include epoxy resins.

It should be noted that the second film layer 0212 may be located within the region surrounded by the blocking structure 004, and the first film layer 0211 and the third film layer 0213 may cover the region surrounded by the blocking structure 004 and further cover the blocking structure 004. That is, the orthographic projection of the blocking structure 004 on the base substrate 001 may be located within the region covered by the encapsulation film layer 021. As such, the encapsulation film layer 021 is ensured to effectively encapsulate respective structures located in the region surrounded by the blocking structure 004.

In the embodiments of the present disclosure, the second film layer 0212 may be manufactured by an ink jet printing (IJP) method. The first film layer 0211 and the third film layer 0213 may be manufactured by a chemical vapor deposition (CVD) method.

Figure 20:
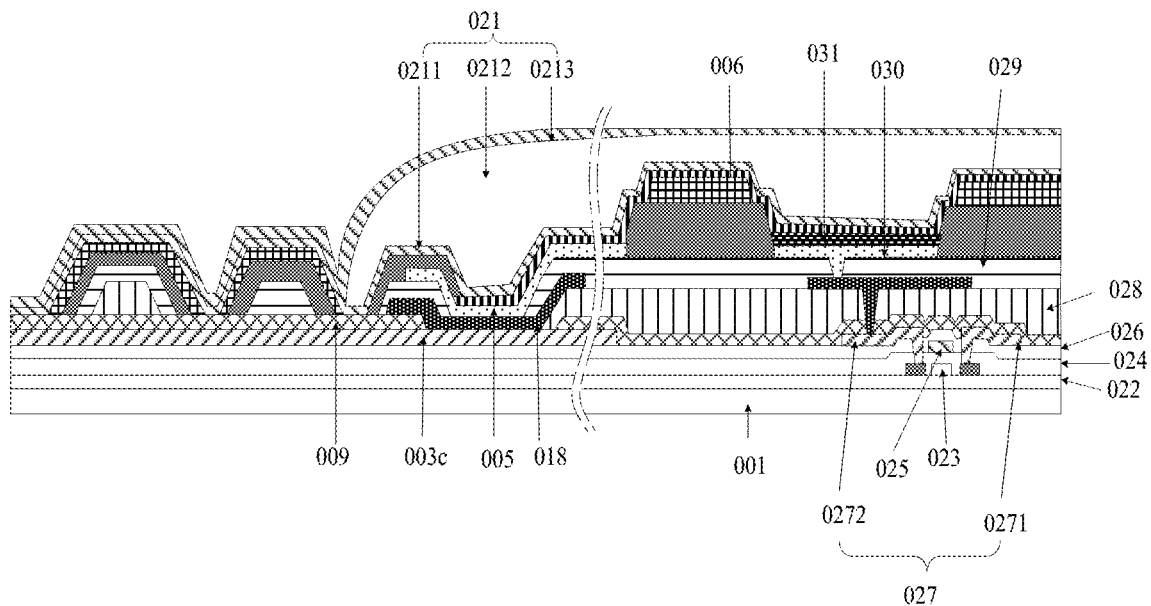
FIG. 20 is a schematic structural diagram of still another display substrate according to an embodiment of the present disclosure.

FIG. 20 is a schematic structural diagram of still another display substrate according to an embodiment of the present disclosure. As can be seen by referring to FIG. 20, a buffer layer 022, a semiconductor layer 023, a gate insulating layer 024, a gate electrode 025, an interlayer dielectric layer 026 and a source-drain electrode layer 027 may be sequentially disposed on the base substrate 001; and the source-drain electrode layer 027 may include a source electrode 0271 and a drain electrode 0272. The source electrode 0271 and the drain electrode 0272 are spaced apart from each other, and may be connected with the semiconductor layer 023 through via holes, respectively. A passivation layer 009, a first planarization layer 028, a second planarization layer 029 and a light-emitting element are sequentially disposed on the source-drain electrode layer 027 along a direction away from the base substrate 001. The light-emitting element may include an anode layer 030, a light-emitting layer 031 and a cathode layer 006 which are sequentially disposed in layers. The anode layer 030 may be electrically connected with the drain electrode 0272 through a via hole. Here, the gate electrode 025, the source electrode 0271 and the drain electrode 0272 constitute a transistor, and each light-emitting element and the transistor to which the light-emitting element is connected may constitute a pixel unit 002.

As can be seen by referring to FIG. 20, the first metal layer 003c included in the first power line 003 may be disposed on the same layer as the source-drain electrode layer 027. The auxiliary connection structure 005 may be disposed in a same layer as the anode layer 030 of the pixel. The auxiliary connection structure 005 may include three film layers. For example, the materials of the three film layers may sequentially be: indium tin oxide (ITO), silver (Ag) and ITO.

Figure 21:
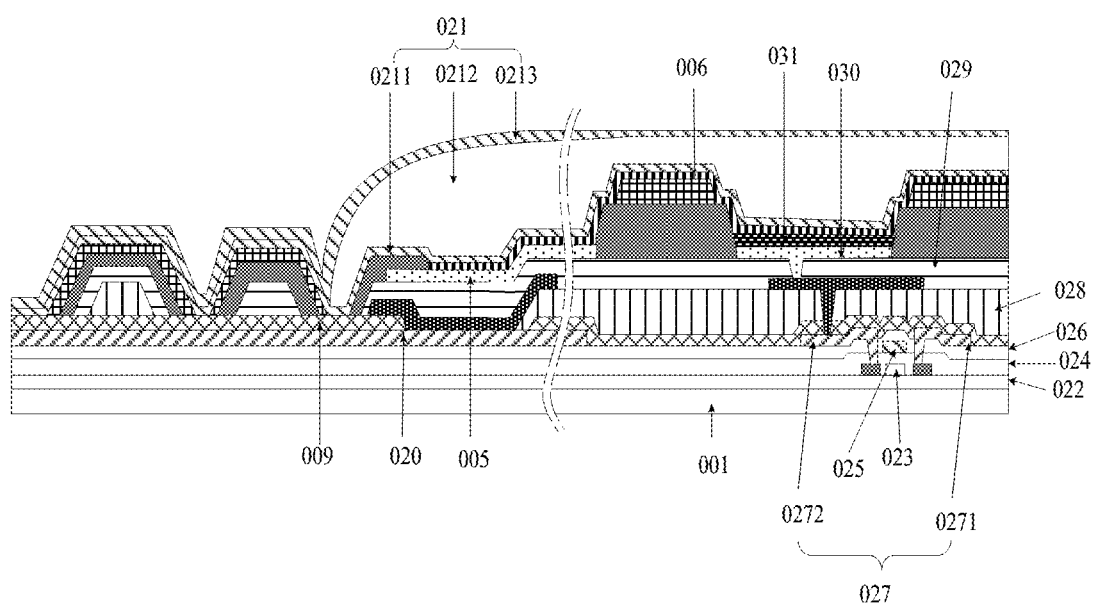
FIG. 21 is a schematic structural diagram of still another display substrate according to an embodiment of the present disclosure.

As can be seen by referring to FIG. 19, the orthographic projection of at least one of the plurality of third power lines 020 on the base substrate may be adjacent to the orthographic projection of the first power line 003 on the base substrate. FIG. 21 is a schematic structural diagram of still another display substrate according to an embodiment of the present disclosure. Referring to FIG. 21, the orthographic projections of the plurality of third power lines 020 on the base substrate 001 may have an overlapping region with the orthographic projection of the auxiliary connection structure 005 on the base substrate 001. Moreover, in the overlapping region, the passivation layer 009 may be provided between the plurality of third power lines 020 and the auxiliary connection structure 005. Furthermore, the plurality of third power lines 020 are not in contact with the auxiliary connection structure 005.

In summary, the embodiments of the present disclosure provide a display substrate, which includes a base substrate, a plurality of pixel units, at least one first power line, a blocking structure, an auxiliary connection structure, a cathode layer and a first organic pattern. A first projection region of an orthographic projection of the auxiliary connection structure on the base substrate and an orthographic projection of the blocking structure on the base substrate do not overlap, such that the first organic pattern is spaced apart from the blocking structure; and therefore, the moisture brought in by one end of the first power line for receiving a power signal can be prevented from being introduced into the pixel units through the blocking structure and the first organic pattern, thereby guaranteeing the yield of the display substrate, as well as the display effect of the display substrate.

Figure 22:
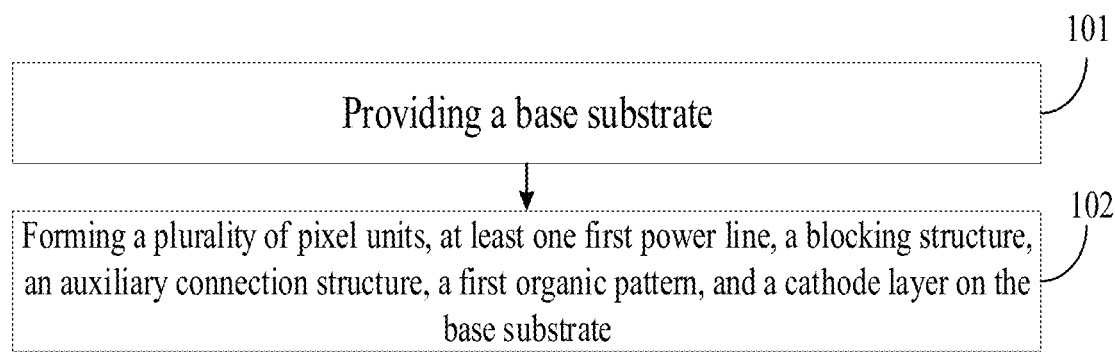
FIG. 22 is a flowchart of a method for manufacturing a display substrate according to an embodiment of the present disclosure.

FIG. 22 is a flowchart of a method for manufacturing a display substrate according to an embodiment of the present disclosure. The method may be used for manufacturing the display substrate according to the above embodiments. As can be seen by referring to FIG. 22, the method may include:

In step 101: a base substrate is provided.

In step 102, a plurality of pixel units, at least one first power line, a blocking structure, an auxiliary connection structure, a first organic pattern, and a cathode layer are formed on the base substrate.

One end 003a of the at least one first power line 003 may be located on a side of the blocking structure 004 distal from the plurality of pixel units 002 and is configured for receiving a power signal, and the other end 003b is located between the blocking structure 004 and the plurality of pixel units 002 and is connected with the cathode layer 006 through the auxiliary connection structure 005. The blocking structure 004 may surround the plurality of pixel units 002.

The auxiliary connection structure 005 may include a first side surface 005a and a second side surface 005b opposite to each other. The first side surface 005a is closer to the plurality of pixel units 002 than the second side surface 005b is.

An orthographic projection of the auxiliary connection structure 005 on the base substrate 001 has a first projection region 005c and a second projection region 005d. The first projection region 005c and an orthographic projection of the blocking structure 004 on the base substrate 001 do not overlap, and the second projection region 005d and the orthographic projection of the blocking structure 004 on the base substrate 001 overlap at a first overlapping regions 00b. The first projection region 005c is closer to the end 003a of the at least one first power line 003 for receiving the power signal than the second projection region 005d is.

It should be noted that in the above step 102, the at least one first power line 003 may be first formed on the base substrate 001, and then the blocking structure 004 and the auxiliary connection structure 005 may be formed on the side of the first power line 003 distal from the base substrate 001. Then, the first organic pattern 007 is formed on the side of the auxiliary connection structure 005 distal from the base substrate 001, and finally, the cathode layer 006 is formed on the side of the first organic pattern 007 distal from the base substrate 001.

Here, the at least one first power line 003 may be formed in a same patterning process as the source electrode and the drain electrode of the thin film transistor in the pixel unit 002. The blocking structure 004 may be formed in the process of forming the planarization layer, the pixel definition layer and the photo spacer. The first organic pattern 007 may be formed in the process of forming the pixel definition layer. The auxiliary connection structure 005 may be formed in a same patterning process as the anode layer 030 in the pixel unit 002.

In summary, the embodiments of the present disclosure provide a method for manufacturing a display substrate. The method may include: sequentially forming a plurality of pixel units, at least one first power line, a blocking structure, an auxiliary connection structure, a first organic pattern and a cathode layer on the base substrate. A first projection region of an orthographic projection of the auxiliary connection structure on the base substrate and an orthographic projection of the blocking structure on the base substrate do not overlap, such that the first organic pattern is spaced apart from the blocking structure; and therefore, the moisture brought in by one end of the first power line for receiving a power signal can be prevented from being introduced into the pixel units through the blocking structure and the first organic pattern, thereby guaranteeing the yield of the display substrate, as well as the display effect of the display substrate.

The embodiments of the present disclosure further provide a display apparatus, which may include any one of the display substrates described in the above embodiments. The display apparatus may be a display apparatus having a foldable screen, and for example, a liquid crystal panel, electronic paper, an organic light-emitting diode (OLED) panel, an active-matrix organic light-emitting diode (AMOLED) panel, a mobile phone, a tablet computer, a television, a display, a notebook computer, a digital photo frame or a navigator and other products or components with a display function.

The foregoing descriptions are merely optional embodiments of the present disclosure and are not intended to limit the present disclosure. Any modifications, equivalent substitutions, improvements and the like within the spirits and principles of the present disclosure should be included in the protection scope of the present disclosure.

What is claimed is:

1. A display substrate, comprising:
   a base substrate;
   a plurality of pixel units, located on the base substrate;
   at least one first power line, located on the base substrate;
   a blocking structure, surrounding the plurality of pixel units;
   an auxiliary connection structure, comprising a first side surface and a second side surface opposite to the first side surface, wherein the first side surface is closer to the plurality of pixel units than the second side surface is;
   a cathode layer, located on a side of the auxiliary connection structure distal from the base substrate; and
   a first organic pattern, located on the side of the auxiliary connection structure distal from the base substrate,
   wherein one end of the at least one first power line is located on a side of the blocking structure distal from the plurality of pixel units, and is configured for receiving a power signal; and the other end of the at least one first power line is located between the blocking structure and the plurality of pixel units, and is connected with the cathode layer through the auxiliary connection structure;
   an orthographic projection of the auxiliary connection structure on the base substrate has a first projection region and a second projection region, the first projection region and an orthographic projection of the blocking structure on the base substrate do not overlap, and the second projection region and the orthographic projection of the blocking structure on the base substrate overlap at a first overlapping region; and
   the first projection region is closer to the end of the at least one first power line for receiving the power signal than the second projection region is.

2. The display substrate according to claim 1, wherein one end of the at least one first power line is located in a middle portion of the side of the blocking structure distal from the plurality of pixel units.

3. The display substrate according to claim 1, wherein the auxiliary connection structure is in a ring construction surrounding the plurality of pixel units.

4. The display substrate according to claim 1, wherein the first organic pattern covers at least a part of the second side surface, an orthographic projection of the first organic pattern and an orthographic projection of the at least one first power line on the base substrate have a second overlapping region, and the second overlapping region and the orthographic projection of the blocking structure on the base substrate do not overlap.

5. The display substrate according to claim 4, wherein the second side surface comprises a portion covered by the first organic pattern and a portion covered by the blocking structure.

6. The display substrate according to claim 4,
wherein a distance between the second overlapping region and the orthographic projection of the blocking structure on the base substrate is greater than a threshold distance,
wherein the threshold distance is in a range from 80 microns to 150 microns.

7. The display substrate according to claim 1, further comprising: at least one second power line, wherein the at least one second power line comprises a first portion and a second portion;
the first portion is located on the side of the blocking structure distal from the plurality of pixel units, and is configured for receiving the power signal;
the second portion is connected with the cathode layer through the auxiliary connection structure; and
the second portion comprises a first junction and a second junction that are connected with the auxiliary connection structure, and a distance between the first junction and the blocking structure is greater than a distance between the second junction and the blocking structure.

8. The display substrate according to claim 7, wherein the display substrate has a bonding region located on the side of the blocking structure distal from the plurality of pixel units; and
the first junction is closer to the bonding region than the second junction is.

9. The display substrate according to claim 7, further comprising at least one of:
a row driving region located between the plurality of pixel units and the blocking structure,
wherein a distance between the row driving region and the orthographic projection of the at least one first power line on the base substrate is greater than a distance between the row driving region and an orthographic projection of the at least one second power line on the base substrate;
a passivation layer covering the at least one first power line,
wherein an opening is further provided in the passivation layer, a side of the auxiliary connection structure proximal to the base substrate is connected with the at least one first power line through the opening, and a side of the auxiliary connection structure distal from the base substrate is connected with the cathode layer;
an encapsulation film layer, wherein the encapsulation film layer is located on a side of the first power line distal from the base substrate, and the encapsulation film layer covers a region surrounded by the blocking structure; or
a plurality of third power lines located on the base substrate, wherein the plurality of third power lines are electrically connected with transistors in pixels of the display substrate.

10. The display substrate according to claim 1, wherein the blocking structure comprises: a first blocking dam and a second blocking dam;
the first blocking dam is farther away from the plurality of pixel units than the second blocking dam is, and a thickness of the first blocking dam is greater than a thickness of the second blocking dam;
the first blocking dam comprises: a first planarization layer pattern, a second planarization layer pattern and a second organic pattern which are arranged along a direction away from the base substrate;
the second blocking dam comprises: a third planarization layer pattern and a third organic pattern which are arranged along the direction away from the base substrate; and
wherein the second planarization layer pattern and the third planarization layer pattern comprise a same material, and the first organic pattern, the second organic pattern and the third organic pattern comprise a same material.

11. The display substrate according to claim 1, wherein the blocking structure comprises: a first blocking dam and a second blocking dam;
the first blocking dam is farther away from the plurality of pixel units than the second blocking dam is, and a thickness of the first blocking dam is greater than a thickness of the second blocking dam;
the first blocking dam comprises: a planarization layer pattern and a second organic pattern which are sequentially arranged in layers along a direction away from the base substrate;
the second blocking dam comprises: a third organic pattern arranged on the base substrate; and
the first organic pattern, the second organic pattern and the third organic pattern comprise a same material.

12. The display substrate according to claim 10, wherein the first blocking dam further comprises: a fourth organic pattern arranged on a side of the second organic pattern distal from the base substrate;
the second blocking dam further comprises: a fifth organic pattern arranged on a side of the third organic pattern distal from the base substrate; and
the fourth organic pattern and the fifth organic pattern comprise a same material.

13. The display substrate according to claim 1, wherein the blocking structure comprises: a first blocking dam and a second blocking dam;
the first blocking dam is farther away from the plurality of pixel units than the second blocking dam is, and a thickness of the first blocking dam is greater than a thickness of the second blocking dam; and
the first organic pattern has a portion which is in direct contact with the second blocking dam.

14. The display substrate according to claim 13, wherein the second power line in the display substrate comprises: a straight portion and an arc-shaped portion which surround a region where the plurality of pixel units are located; and
an orthographic projection of the portion of the first organic pattern which is in direct contact with the second blocking dam on the base substrate is located within an orthographic projection of the arc-shaped portion on the base substrate.

15. The display substrate according to claim 10, wherein the first blocking dam is a first ring, and the second blocking dam is a second ring;
the first organic pattern and a part of the third organic pattern define a third ring, an orthographic projection of the third ring on the base substrate is located within an orthographic projection of the second ring on the base substrate, and the orthographic projection of the second ring on the base substrate is located within an orthographic projection of the first ring on the base substrate; and
the third ring surrounds the plurality of pixel units.

16. The display substrate according to claim 1, wherein the at least one first power line comprises: a first metal layer;

the display substrate further comprises: an auxiliary metal layer located on a side of the first metal layer distal from the base substrate; and a side of the auxiliary metal layer distal from the first metal layer is in contact with the auxiliary connection structure, and an orthographic projection of the auxiliary metal layer on the base substrate and the orthographic projection of the blocking structure on the base substrate do not overlap.

17. The display substrate according to claim 1, wherein the at least one first power line comprises: a first metal layer and a second metal layer which are arranged along a direction away from the base substrate; and a side of the second metal layer distal from the first metal layer is in contact with the auxiliary connection structure.

18. The display substrate according to claim 1, wherein a plurality of tooth-shaped protruding structures are provided on a side surface of the at least one first power line located on the side of the blocking structure distal from the plurality of pixel units.

19. The display substrate according to claim 9, wherein an orthographic projection of at least one of the plurality of third power lines on the base substrate is adjacent to the orthographic projection of the first power line on the base substrate; and orthographic projections of the plurality of third power lines on the base substrate and the orthographic projection of the auxiliary connection structure on the base substrate have an overlapping region, and in the overlapping region, a passivation layer is disposed between the plurality of third power lines and the auxiliary connection structure.

20. A display apparatus, comprising the display substrate according to claim 1.

* * * * *